(12) United States Patent
Liu et al.

(10) Patent No.: US 8,542,573 B2
(45) Date of Patent: Sep. 24, 2013

(54) UPLINK BASEBAND SIGNAL COMPRESSION METHOD, DECOMPRESSION METHOD, DEVICE AND SYSTEM

(71) Applicant: Huawei Technologies Co., Ltd., Guangdong (CN)

(72) Inventors: Sheng Liu, Shenzhen (CN); Rongdao Yu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/622,269

(22) Filed: Sep. 18, 2012

(65) Prior Publication Data

US 2013/0083768 A1 Apr. 4, 2013

Related U.S. Application Data

(63) Continuation of application No. PCT/CN2011/080396, filed on Sep. 30, 2011.

(51) Int. Cl.
*H04J 11/00* (2006.01)

(52) U.S. Cl.
USPC . 370/210; 370/480; 375/240.03; 375/240.18; 375/240.2; 375/240.25

(58) Field of Classification Search
USPC .............. 370/210, 480; 375/133, 135, 136, 375/240.03, 240.18, 240.2, 240.25, 240.26
See application file for complete search history.

(56) References Cited

U.S. PATENT DOCUMENTS

| | | | |
|---|---|---|---|
| 5,471,464 A * | 11/1995 | Ikeda | 370/203 |
| 6,292,777 B1 | 9/2001 | Inoue et al. | |
| 6,628,606 B1 * | 9/2003 | Hong et al. | 370/208 |
| 7,649,861 B2 * | 1/2010 | Maltsev et al. | 370/328 |

(Continued)

FOREIGN PATENT DOCUMENTS

| | | |
|---|---|---|
| CN | 1238514 A | 12/1999 |
| CN | 101069399 A | 11/2007 |

(Continued)

OTHER PUBLICATIONS

Partial Translation of International Search Report dated Jul. 12, 2012 in connection with International Patent Application No. PCT/CN2011/080396.

(Continued)

*Primary Examiner* — Alvin Zhu

(57) ABSTRACT

Embodiments of the present invention disclose an RRU, which performs IDFT on a PUSCH signal that is obtained after resource block demapping, where due to a characteristic of an extremely low peak to average power ratio of SC-FDMA modulation, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively.

23 Claims, 23 Drawing Sheets

(56) References Cited

U.S. PATENT DOCUMENTS

| | | | |
|---|---|---|---|
| 2004/0022183 A1* | 2/2004 | Li et al. | 370/210 |
| 2005/0169408 A1* | 8/2005 | Kim | 375/343 |
| 2006/0114816 A1 | 6/2006 | Maltsev et al. | |
| 2007/0050440 A1* | 3/2007 | Lee et al. | 708/400 |
| 2011/0044383 A1* | 2/2011 | Maruyama et al. | 375/232 |
| 2011/0135013 A1 | 6/2011 | Wegener | |
| 2011/0211549 A1* | 9/2011 | Au et al. | 370/329 |
| 2012/0082117 A1 | 4/2012 | Lee et al. | |
| 2012/0190389 A1* | 7/2012 | Hui | 455/500 |

FOREIGN PATENT DOCUMENTS

| | | |
|---|---|---|
| CN | 101828353 A | 9/2010 |
| CN | 102026280 A | 4/2011 |
| WO | WO 2010/075864 A1 | 7/2010 |
| WO | WO 2012/109127 A1 | 8/2012 |

OTHER PUBLICATIONS

Partial Translation of Written Opinion of the International Searching Authority dated Jul. 12, 2012 in connection with International Patent Application No. PCT/CN2011/080396.

Supplementary European Search Report dated Feb. 19, 2013 in connection with European Patent Application No. EP 11 86 0105.3, 8 pages.

Emmanuel Ravelli, et al., "Embedded Polar Quantization", IEEE Signal Processing Letters, vol. 14, No. 10, Oct. 2007, p. 657-660.

Yoong Choon Chang, et al., "A Low Complexity Hierarchical QAM Symbol Bits Allocation Algorithm for Unequal Error Protection of Wireless Video Transmission", IEEE Transactions on Consumer Electronics, vol. 55, No. 3, Aug. 1, 2009, p. 1089-1097.

* cited by examiner

UPLINK BASEBAND SIGNAL COMPRESSION METHOD, DECOMPRESSION METHOD, DEVICE AND SYSTEM

CROSS-REFERENCE TO RELATED APPLICATIONS

This application is a continuation of International Application No. PCT/CN2011/080396, filed on Sep. 30, 2011, which is hereby incorporated by reference in its entirety.

TECHNICAL FIELD

The present invention relates to the field of communications, and in particular, to an uplink baseband signal compression device, method and system.

BACKGROUND

Compared with a conventional macro base station, a whole system of a remote-radio distributed base station is divided into two parts, namely, a baseband processing unit BBU (Baseband Unit) and a remote radio frequency unit RRU (Remote RF Unit). The RRU is placed at an access point far away from the BBU, the RRU and the BBU are connected through an optical fiber and transmit a wireless baseband signal in an analog or digital manner, and a distance between the BBU and the RRU is generally tens of meters to one or two hundred meters. In this way, network construction of a system becomes more flexible and convenient, antenna installation is not influenced by an equipment room location, and it is also convenient to design large capacity for a base station system, which facilitates reduction of system cost. A distributed antenna system DAS (Distributed Antenna System) is similar to a remote-radio distributed base station, but a distance between a BBU and an RRU may be extended to several kilometers or even tens of kilometers, and in addition to a direct connection through an optical fiber, a connection through an optical transport network such as a PON (Passive Optical Network, passive optical network) or a WDM (Wave Division Multiplexing, wave division multiplexing) is also adopted. Furthermore, a multi-cell joint processing manner, such as network MIMO (multiple-input multiple-output system) or multi-cell joint scheduling, is preferably adopted to reduce inter-cell interference, thereby further increasing system capacity.

With the emergence of 3G/4G technologies such as LTE, wireless spectra become increasingly wider (20 MHz-100 MHz), and meanwhile, with wide application of multi-antenna technologies such as MIMO, an increasingly greater bandwidth is required for transmitting a wireless baseband signal between the BBU and the RRU. Taking the LTE as an example, for a bandwidth of 20 MHz, 2048-point FFT is adopted, a sub-carrier interval is 15 KHz, and a sampling rate of baseband signals is 2048×15 KHz=30.72 Msps, and for an RRU with 4×4 MIMO configuration, 16-bit ADC/DAC (analog to digital conversion/digital to analog conversion) is adopted, and a transmission line between the BBU and the RRU adopts 8B/10B coding, and therefore, a bit rate of an uplink/downlink baseband signal is up to: 30.72 (Msps)×4 (antenna)×16 (bit)×2 (I/Q component)/(8/10)≈5 Gbps.

Therefore, effectively compressing a wireless baseband signal to reduce a baseband signal transmission bandwidth between a BBU and an RRU is an important requirement.

SUMMARY

Embodiments of the present invention provide an uplink baseband compression device, method and system, for compressing an LTE uplink baseband signal, so as to reduce a baseband signal transmission bandwidth between a BBU and an RRU in an LTE system.

An embodiment of the present invention discloses a baseband data compression device, including:

a signal obtaining module, configured to obtain a physical uplink shared channel PUSCH signal according to an uplink time-domain baseband signal of a user;

a frequency-time transform module, configured to perform inverse discrete Fourier transform IDFT on the PUSCH signal to obtain a time-domain PUSCH signal;

an amplitude/phase conversion module, configured to perform amplitude/phase conversion on the time-domain PUSCH signal to obtain an amplitude signal and a phase signal of the time-domain PUSCH signal; and a quantization module, configured to perform amplitude quantization and phase quantization on the amplitude signal and the phase signal of the time-domain PUSCH signal respectively to obtain a quantized amplitude signal and a quantized phase signal of the time-domain PUSCH signal.

An embodiment of the present invention further discloses a baseband data decompression device, including:

a first obtaining module, configured to obtain a quantized amplitude signal and a quantized phase signal of a time-domain PUSCH signal;

an I/Q conversion module, configured to perform I/Q conversion on the quantized amplitude signal and the quantized phase signal of the time-domain PUSCH signal to obtain a complex PUSCH signal, where the complex PUSCH signal is a complex signal formed by I/Q components;

a first transform module, configured to perform discrete Fourier transform DFT on the complex PUSCH signal to map the complex PUSCH signal to a frequency domain;

a second transform module, configured to perform IDFT on the PUSCH signal that undergoes the DFT, to obtain a time-domain PUSCH signal;

a demodulation module, configured to perform constellation demodulation on the time-domain PUSCH signal to obtain demodulated data; and a decoding module, configured to perform channel decoding on the demodulated data to obtain uplink data of a user.

An embodiment of the present invention further discloses an uplink baseband signal compression method, including:

obtaining a physical uplink shared channel PUSCH signal according to an uplink time-domain baseband signal of a user;

performing inverse discrete Fourier transform IDFT on the PUSCH signal to obtain a time-domain PUSCH signal;

performing amplitude/phase conversion on the time-domain PUSCH signal to obtain an amplitude signal and a phase signal of the time-domain PUSCH signal; and performing amplitude quantization and phase quantization on the amplitude signal and the phase signal of the time-domain PUSCH signal respectively to obtain a quantized amplitude signal and a quantized phase signal of the time-domain PUSCH signal.

An embodiment of the present invention further discloses an uplink baseband signal decompression method, including:

obtaining a quantized amplitude signal and a quantized phase signal of a time-domain PUSCH signal;

performing I/Q conversion on the quantized amplitude signal and the quantized phase signal of the time-domain PUSCH signal to obtain a complex PUSCH signal, where the complex PUSCH signal is a complex signal formed by I/Q components;

performing discrete Fourier transform DFT on the complex PUSCH signal to map the complex PUSCH signal to a frequency domain;

performing IDFT on the PUSCH signal that undergoes the DFT, to obtain a time-domain PUSCH signal;

performing constellation demodulation on the time-domain PUSCH signal to obtain demodulated data; and decoding the demodulated data to obtain uplink data of a user.

An embodiment of the present invention further discloses a base station system, including the baseband data compression device and the baseband data decompression device as described in the foregoing.

An embodiment of the present invention further discloses a base station system, including a baseband data compression device and a baseband data decompression device, where the baseband data compression device is configured to obtain a physical uplink shared channel PUSCH signal according to an uplink time-domain baseband signal of a user; perform inverse discrete Fourier transform IDFT on the PUSCH signal to obtain a time-domain PUSCH signal; perform amplitude/phase conversion on the time-domain PUSCH signal to obtain an amplitude signal and a phase signal of the time-domain PUSCH signal; and perform amplitude quantization and phase quantization on the amplitude signal and the phase signal of the time-domain PUSCH signal respectively to obtain a quantized amplitude signal and a quantized phase signal of the time-domain PUSCH signal; and the baseband data decompression device is configured to obtain a quantized amplitude signal and a quantized phase signal of the time-domain PUSCH signal; perform I/Q conversion on the quantized amplitude signal and the quantized phase signal of the time-domain PUSCH signal to obtain a complex PUSCH signal, where the complex PUSCH signal is a complex signal formed by I/Q components; perform discrete Fourier transform DFT on the complex PUSCH signal to map the complex PUSCH signal to a frequency domain; perform IDFT on the PUSCH signal that undergoes the DFT, to obtain a time-domain PUSCH signal; perform constellation demodulation on the time-domain PUSCH signal to obtain demodulated data; and decode the demodulated data to obtain uplink data of the user.

In the embodiments of the present invention, with the foregoing technical solutions, during LTE uplink transmission, compression processing is performed on a signal at an RRU side, where IDFT is performed on a PUSCH signal according to the methods provided in the embodiments of the present invention; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently; and corresponding decompression processing is adopted at a BBU side to recover data of a user, so that a transmission bandwidth of a baseband signal can be greatly reduced, thereby improving utilization efficiency of a resource.

BRIEF DESCRIPTION OF THE DRAWINGS

To describe the technical solutions in the embodiments of the present invention or in the prior art more clearly, the accompanying drawings required for describing the embodiments or the prior art are introduced briefly in the following. Apparently, the accompanying drawings in the following descriptions are merely some embodiments of the present invention, and persons of ordinary skill in the art may also obtain other drawings according to these accompanying drawings without creative efforts.

DETAILED DESCRIPTION

The technical solutions in the embodiments of the present invention are clearly and fully described in the following with reference to the accompanying drawings in the embodiments of the present invention. Apparently, the embodiments to be described are only a part rather than all of the embodiments of the present invention. Based on the embodiments of the present invention, all other embodiments obtained by persons of ordinary skill in the art without creative efforts shall fall within the protection scope of the present invention.

In order to enable persons of ordinary skill in the art to better understand the technical solutions in the embodiments of the present invention and beneficial effects of the technical solutions, the technical solutions related to the embodiments of the present invention are introduced in the following.

The OFDM (Orthogonal Frequency Division Multiplexing, orthogonal frequency division multiplexing) technology is a key technology in the LTE. Since an OFDM time-domain signal is a signal formed by superimposing several multi-carriers, a high PAPR (Peak to Average Power Ratio, peak to average power ratio) is caused. A relatively weak limitation is imposed on power at a base station side, and a relatively expensive power amplifier may be adopted, and therefore, influence of a high PAPR is not great in downlink. However, in uplink, being limited by the cost of a terminal, a high PAPR may have an extremely high requirement on a power amplifier of the terminal, which reduces power utilization of the terminal. To avoid the influence of a high PAPR caused by OFDM, an SC-FDMA (Single Carrier Frequency Division Multiple Access, single carrier frequency division multiple access) modulation mode is adopted in LTE uplink. With the SC-FDMA technology, DFT (Discrete Fourier transform, discrete Fourier transform) extension is performed on a signal before IFFT (Inverse Fast Fourier Transformation, inverse fast Fourier transformation) modulation of OFDM, and in this way, a system transmits a time-domain signal, so that a PAPR problem caused by transmitting a frequency-domain signal in an OFDM system can be avoided.

Figure 1:
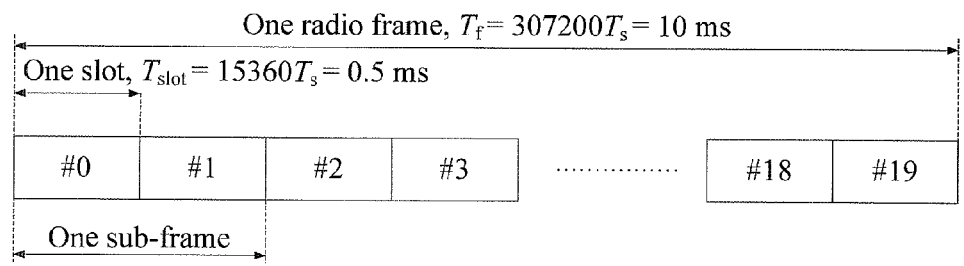
FIG. 1 is a schematic diagram of a frame structure of an LTE system according to an embodiment of the present invention.

FIG. 1 is a schematic diagram of a frame structure of an LTE system according to an embodiment of the present invention. As shown in FIG. 1, a 10 ms radio frame (radio frame) is divided into ten 1 ms sub-frames (sub-frame), and each sub-frame includes two slots (slot). LTE uplink signal processing is performed periodically at a certain transmission time interval (TTI, Transmission Time Interval), which is one sub-frame (sub-frame) in the LTE, and corresponds to time of 1 ms.

A minimum resource unit used for LTE uplink transmission is called resource element (resource element, RE). An LTE uplink physical channel corresponds to a set of a series of REs, and is used for bearing information from a higher layer. In LTE uplink, the following uplink channels are defined: a physical uplink shared channel PUSCH (Physical Uplink Shared Channel), a physical uplink control channel PUCCH (Physical Uplink Control Channel), and a physical random access channel PRACH (Physical Random Access Channel).

In addition to uplink physical channels, in the LTE, an uplink physical signal is further defined, where the uplink physical signal refers to a signal that is used by a physical layer but does not bear any information from a higher layer, such as an uplink reference signal RS (Reference Signal).

Figure 2:
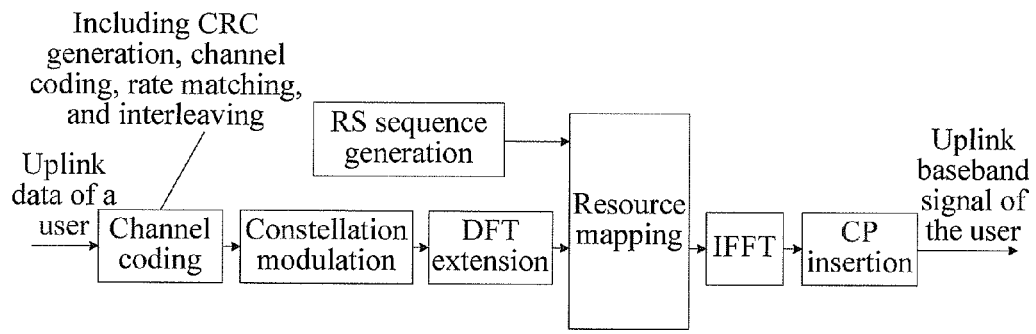
FIG. 2 is a flow chart of generation of a baseband signal of an LTE PUSCH according to an embodiment of the present invention.

FIG. 2 is a flow chart of generation of a baseband signal of an LTE physical uplink shared channel (PUSCH) according to an embodiment of the present invention. As shown in FIG. 2, in one TTI, uplink data of each user undergoes channel coding (including one or multiple kinds of the following: bit scrambling, CRC check sequence generation, channel coding, channel interleaving, and rate matching) and then undergoes constellation modulation mapping (including QPSK modulation, 16QAM modulation, or 64QAM modulation), where a data symbol sequence obtained after modulation is input to a DFT extension module to map a data stream to a frequency domain, resource mapping is performed on a frequency-domain data symbol sequence and a reference symbol (reference signal, RS) together, and data of different users is mapped to different orthogonal sub-carriers to achieve orthogonal frequency multiplexing among users; and then the signal is transformed to a time domain through IFFT, and a CP (Cyclic Prefix, cyclic prefix) is inserted, to form an uplink baseband signal of the user.

Figure 3:
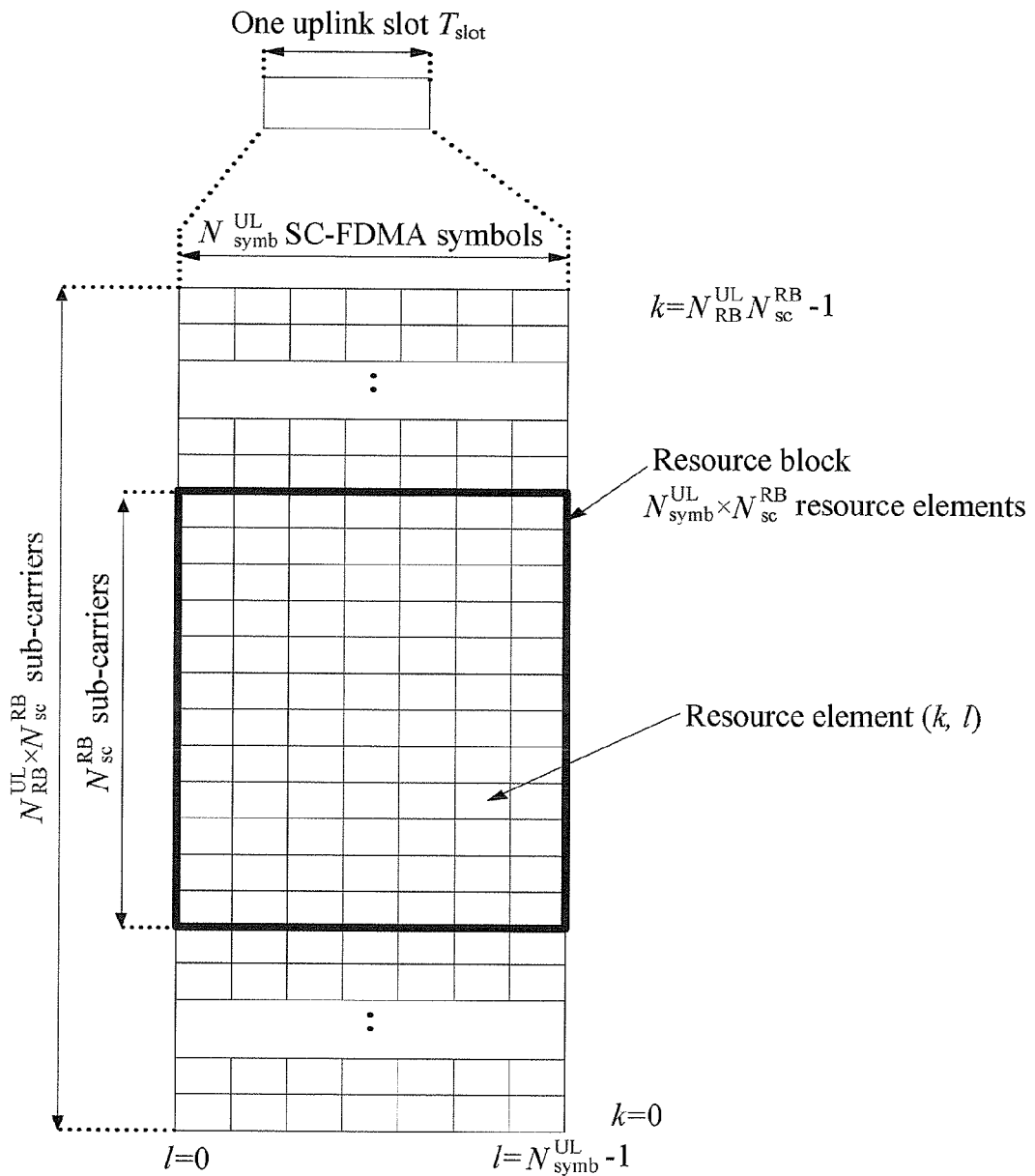
FIG. 3 is a schematic diagram of an LTE uplink resource grid according to an embodiment of the present invention.

FIG. 3 is a schematic diagram of an LTE uplink resource grid according to an embodiment of the present invention. LTE uplink resource allocation is based on a resource block (RB: resource block), where one RB includes M consecutive SC-FDMA blocks in a time domain and N equivalent sub-carriers in a frequency domain. In an OFDMA system, generally, air interface resources are categorized in the form of resource blocks, and as shown in FIG. 3, a signal transmitted in one LTE uplink slot may be described by using one resource grid, one resource grid is formed by several resource blocks, and one resource block RB includes 12 sub-carriers in a frequency domain and SC-FDMA blocks in a time domain in the case of normal CP configuration, and includes 12 sub-carriers in the frequency domain and 6 SC-FDMA blocks in the time domain in the case of extended CP configuration. For user data transmission, a time/frequency resource allocated to each user is generally one logically virtual resource block (VRB), and a system then maps the VRB that is allocated to the user to a physical resource block PRB within a certain time/frequency range according to a predefined algorithm. When allocating a resource to a user, the system specifies information such as type, number and size of a corresponding VRB resource, namely, VRB indication information, so that a corresponding sub-carrier actually occupied by the user in each OFDM symbol time can be obtained according to the predefined algorithm. Therefore, with resource block mapping and demapping described in the foregoing, user multiplexing and demultiplexing operations are completed, and specifically, resource block mapping is allocating a signal of each user to a corresponding sub-carrier, and resource block demapping is separating a signal of each user from a corresponding sub-carrier.

VRBs are generally classified into two types: a localized (Localized) type and a distributed (Distributed) type, where a localized VRB corresponds to consecutive sub-carriers, which facilitates implementation of frequency selective scheduling and MIMO precoding; and a distributed VRB distributes sub-carriers of one user into a whole system bandwidth, so that a frequency diversity gain may be obtained, and the distributed VRB is generally used for transmitting a service with a small data amount such as VoIP (broadband telephony, Voice over Internet Protocol). The VRB is not only a minimum allocation unit of a resource occupied by a user, but is also a minimum configuration unit of a wireless transmission parameter of a physical layer, that is to say, no matter for the localized VRB or the distributed VRB, sub-carriers of a certain data stream of one user in one VRB always have the same code modulation mode and transmit power. In one embodiment, with reference to a characteristic of LTE uplink transmission, only a localized VRB is adopted in LTE uplink. An eNodeB may allocate a plurality of RBs to one UE, and notify the UE through uplink resource grant (Uplink Resource Grant) signaling.

Figure 4:
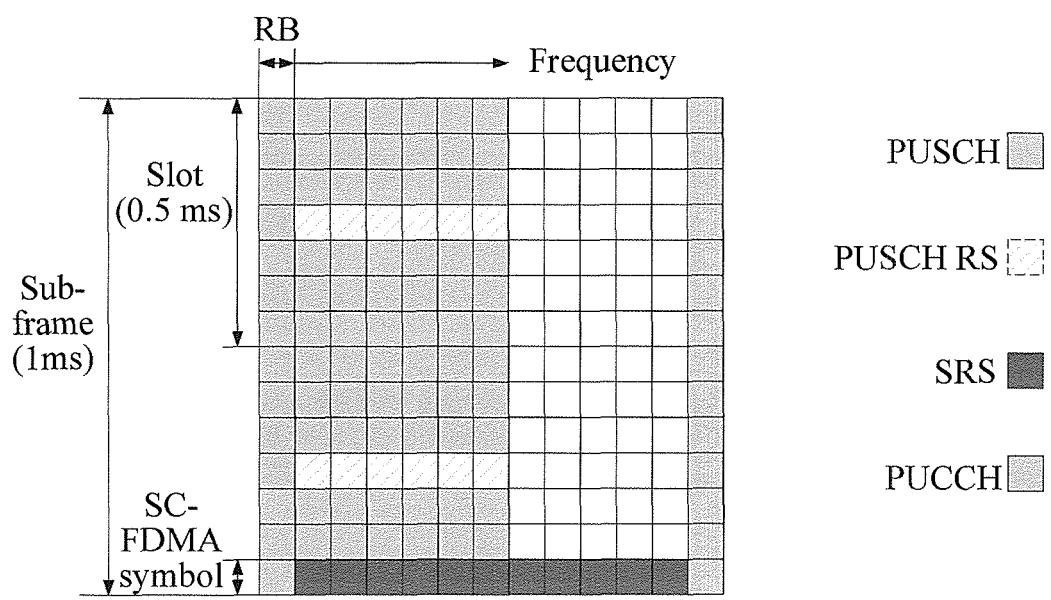
FIG. 4 is a schematic diagram of distribution of various LTE uplink physical channels and reference signals in time and frequency domains according to an embodiment of the present invention.

FIG. 4 is a schematic diagram of distribution of various LTE uplink physical channels and reference signals in time and frequency domains according to an embodiment of the present invention.

A physical uplink control channel PUCCH is used for transmitting signaling such as CQI (channel quality indicator, channel quality indicator)/ACK (Acknowledgement, acknowledgement), and as shown in FIG. 4, in a two-dimensional time-frequency plane, the PUCCH is fixed at the highest end and the lowest end of a user bandwidth, and is multiplexed with a data channel in a frequency division manner, and when no data is transmitted, a independent PUCCH does not adopt DFT extension, and PUCCH multiplexing of multiple users is performed in a code division manner (for example, code spreading). As shown in FIG. 4, a physical uplink shared channel demodulation reference signal (PUSCH RS) uses a constant amplitude zero auto-correlation (CAZAC) sequence, is multiplexed with the physical uplink shared channel in a time division manner, and is mainly used for demodulating uplink user data. As shown in FIG. 4, an uplink Sounding reference signal (SRS) is multiplexed with the physical uplink shared channel in a time division manner, and is used for channel detection. Distribution of the physical uplink shared channel PUSCH in the two-dimensional time-frequency plane is as shown in FIG. 4, and the PUSCH may adopt QPSK, 16QAM or 64QAM modulation.

Figure 25:
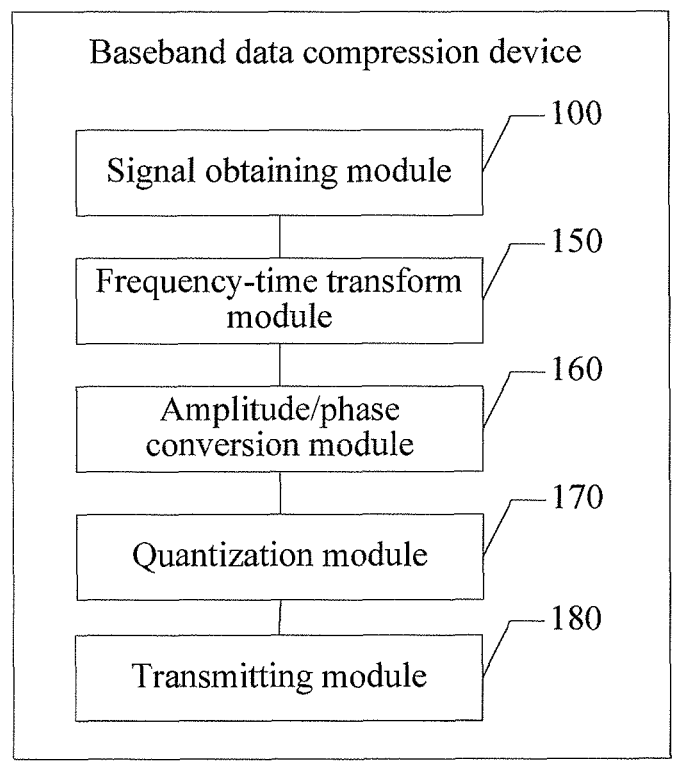
FIG. 25 is a structural diagram of a baseband data compression device according to an embodiment of the present invention.

Based on structures of the foregoing LTE uplink physical channel and reference signal, and a characteristic of an extremely low peak to average power ratio of SC-FDMA, as shown in FIG. 25, an embodiment of the present invention provides a baseband data compression device, including:

a signal obtaining module 100, configured to obtain a physical uplink shared channel PUSCH signal according to an uplink time-domain baseband signal of a user;

a frequency-time transform module 150, configured to perform inverse discrete Fourier transform IDFT on the PUSCH signal to obtain a time-domain PUSCH signal;

an amplitude/phase conversion module 160, configured to perform amplitude/phase conversion on the time-domain PUSCH signal to obtain an amplitude signal and a phase signal of the time-domain PUSCH signal; and a quantization module 170, configured to perform amplitude quantization and phase quantization on the amplitude signal and the phase signal of the time-domain PUSCH signal respectively to obtain a quantized amplitude signal and a quantized phase signal of the time-domain PUSCH signal.

Figure 5:
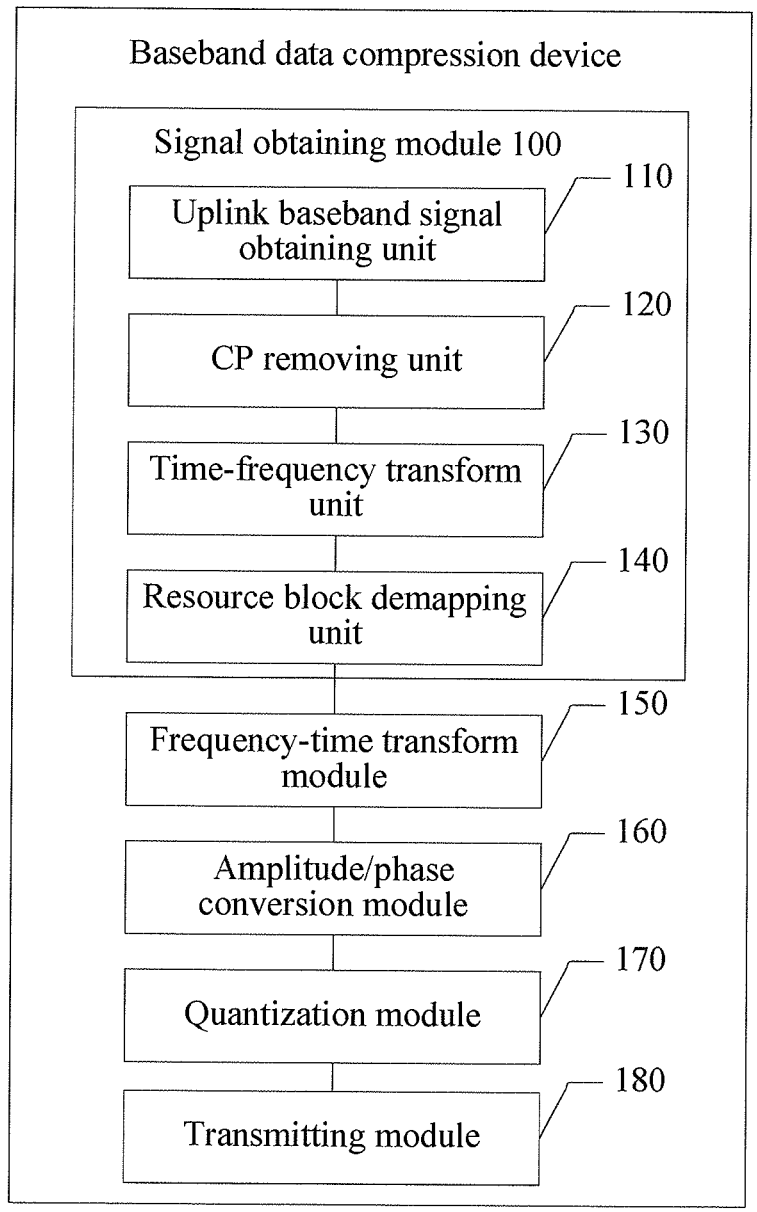
FIG. 5 is a structural diagram of a baseband data compression device according to an embodiment of the present invention.

Specifically, in one embodiment, as shown in FIG. 5, a signal obtaining module 100 may include an uplink baseband signal obtaining unit 110, a CP removing unit 120, a time-frequency transform unit 130, and a resource block demapping unit 140, and according to FIG. 5, each unit and module are described as follows.

The uplink baseband signal obtaining unit 110 is configured to obtain an uplink time-domain baseband signal of a user, where the uplink time-domain baseband signal of the user is a complex signal formed by I/Q components.

The CP removing unit 120 is configured to remove a CP of the uplink time-domain baseband signal of the user to obtain a CP-removed uplink time-domain baseband signal.

The time-frequency transform unit 130 is configured to perform FFT on the CP-removed uplink time-domain baseband signal to transform the CP-removed uplink time-domain baseband signal into an uplink frequency-domain baseband signal.

The resource block demapping unit 140 is configured to perform resource block demapping on the uplink frequency-domain baseband signal to separate a PUSCH signal from the uplink frequency-domain baseband signal.

In one embodiment, resource block demapping may also be performed on the uplink frequency-domain baseband signal to separate a physical uplink control channel PUCCH, an uplink demodulation reference signal RS and an uplink Sounding reference signal from the uplink frequency-domain baseband signal.

The frequency-time transform module 150 is configured to perform IDFT on the PUSCH signal to obtain a time-domain PUSCH signal.

The amplitude/phase conversion module 160 is configured to perform amplitude/phase conversion on the time-domain PUSCH signal to obtain an amplitude signal and a phase signal of the time-domain PUSCH signal.

The quantization module 170 is configured to perform amplitude quantization and phase quantization on the amplitude signal and the phase signal of the time-domain PUSCH signal respectively to obtain a quantized amplitude signal and a quantized phase signal of the time-domain PUSCH signal.

Due to a characteristic of a low peak to average power ratio of SC-FDMA, in one embodiment, the amplitude signal may be quantized by using a small number of bits, and the phase signal may be quantized by using an ordinary number of bits.

A transmitting module 180 is configured to transmit the quantized amplitude signal and the quantized phase signal of the time-domain PUSCH signal.

Further, in one embodiment, since resource block demapping is performed on the uplink frequency-domain baseband signal, a physical uplink control channel PUCCH, an uplink reference signal RS and an uplink Sounding reference signal may also be separated from the uplink frequency-domain baseband signal. Since the uplink reference signal RS adopts a constant envelope sequence, compression processing may also be performed on the RS.

In one embodiment, the amplitude/phase conversion module 160 is further configured to perform amplitude/phase conversion on the RS to obtain an amplitude signal and a phase signal of the RS.

The quantization module 170 is further configured to perform amplitude quantization and phase quantization on the amplitude signal and the phase signal of the RS respectively to obtain a quantized amplitude signal and a quantized phase signal of the RS.

The transmitting module 180 is further configured to transmit the quantized amplitude signal and the quantized phase signal of the RS.

Figure 22:
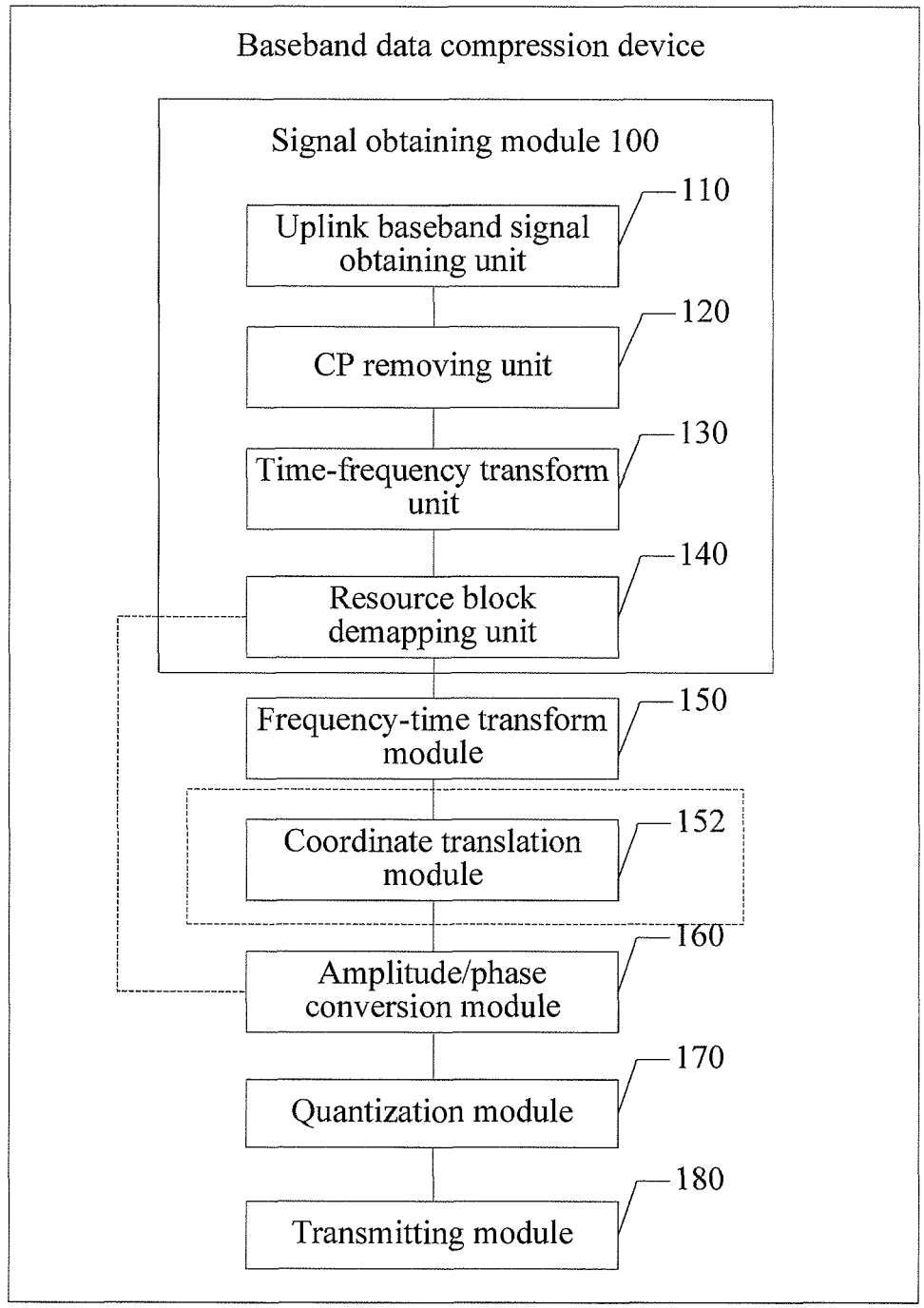
FIG. 22 is a structural diagram of a baseband data compression device according to an embodiment of the present invention.

In one embodiment, as shown in FIG. 22, the RRU may further include:

a coordinate translation module 152, configured to translate, according to a constellation quadrant where the time-domain PUSCH signal is located, an origin of coordinates to a preset position in the constellation quadrant where the time-domain PUSCH signal is located, and obtain coordinates of the time-domain PUSCH signal after the origin of coordinates is translated; where accordingly, the amplitude/phase conversion module 160 is specifically configured to perform amplitude/phase conversion on the time-domain PUSCH signal according to the coordinates of the time-domain PUSCH signal, where the coordinates of the time-domain PUSCH signal are obtained after the origin of coordinates is translated, to obtain an amplitude signal and a phase signal of the time-domain PUSCH signal.

By translating the origin of coordinates according to the constellation quadrant where the time-domain PUSCH signal is located, a quantization range can be reduced, thereby further improving a compression ratio.

It should be noted that, in one embodiment, the baseband data compression device may be deployed on the RRU.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently.

Figure 6:
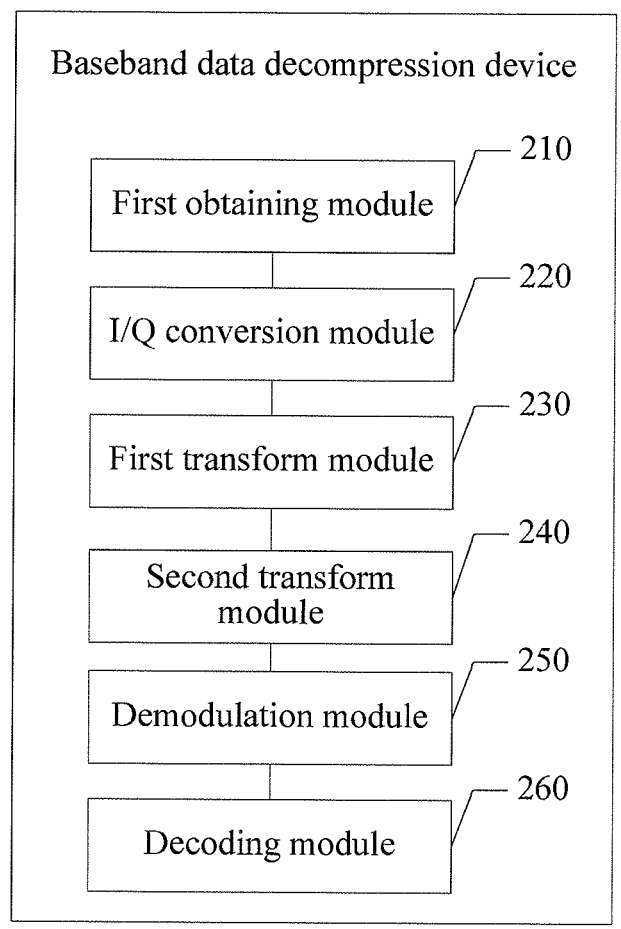
FIG. 6 is a structural diagram of a baseband data decompression device according to an embodiment of the present invention.

As shown in FIG. 6, an embodiment of the present invention provides a baseband data decompression device, including:

A first obtaining module 210 is configured to obtain a quantized amplitude signal and a quantized phase signal of a time-domain PUSCH signal.

It should be noted that, the quantized amplitude signal and the quantized phase signal of the time-domain PUSCH signal are transmitted from a baseband data compression device on an RRU in one embodiment.

An I/Q conversion module 220 is configured to perform I/Q conversion on the quantized amplitude signal and the quantized phase signal of the time-domain PUSCH signal to obtain a complex PUSCH signal, where the complex PUSCH signal is a complex signal formed by I/Q components.

A first transform module 230 is configured to perform DFT on the complex PUSCH signal to map the complex PUSCH signal to a frequency domain.

A second transform module 240 is configured to perform IDFT on the PUSCH signal that undergoes the DFT, to obtain a time-domain PUSCH signal;

A demodulation module 250 is configured to perform constellation demodulation on the time-domain PUSCH signal to obtain demodulated data.

A decoding module 260 is configured to perform channel decoding on the demodulated data to obtain uplink data of a user.

It should be noted that, in one embodiment, the baseband data decompression device may be deployed on a BBU.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently; and corresponding decompression processing is adopted at a BBU side to recover data of a user, so that a transmission bandwidth of a baseband signal can be greatly reduced, thereby improving utilization efficiency of a resource.

Figure 7:
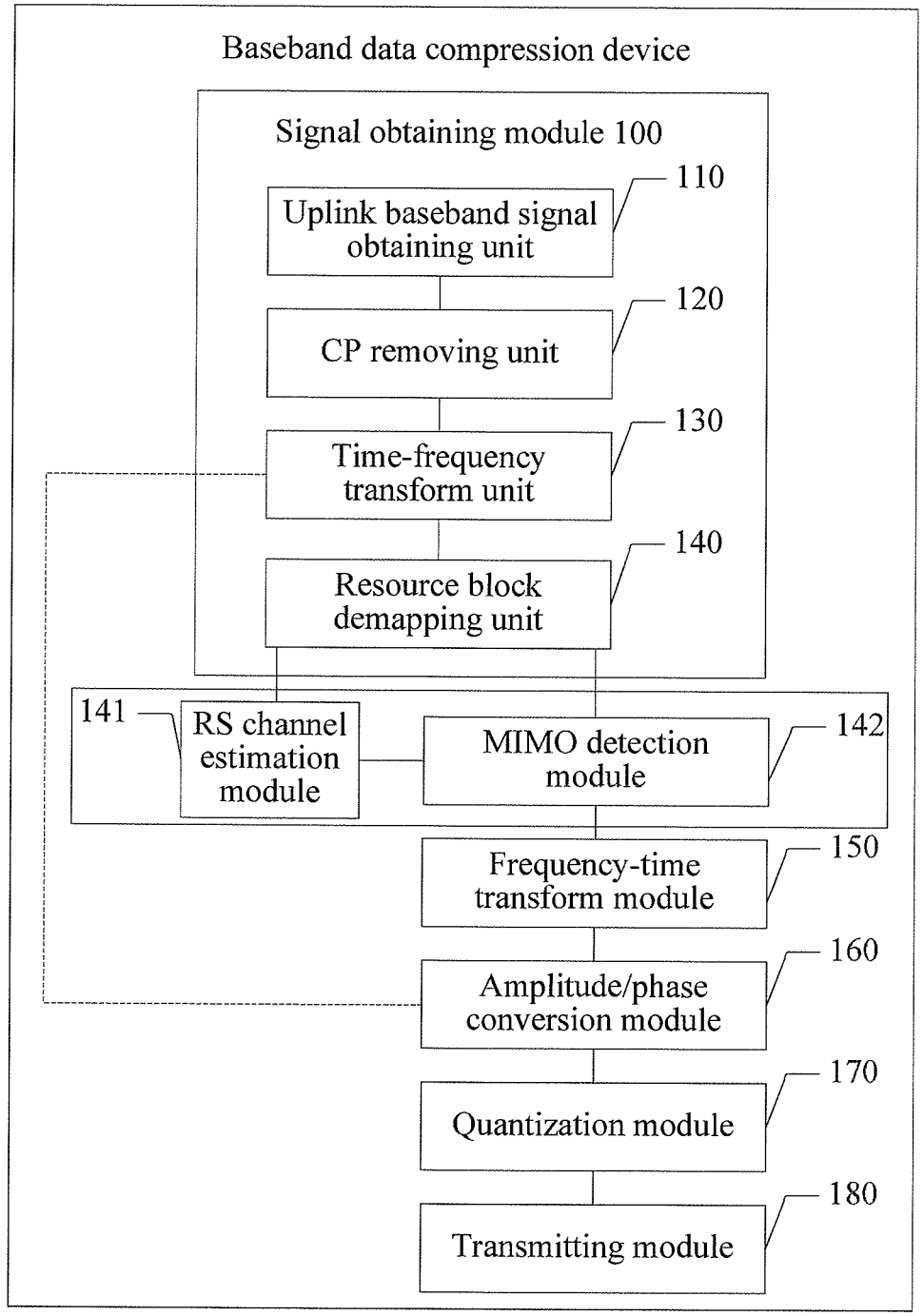
FIG. 7 is a structural diagram of a baseband data compression device according to an embodiment of the present invention.

In one embodiment, when MIMO transmission or virtual MIMO transmission is adopted in uplink, as shown in FIG. 7, the baseband data compression device may include:

An uplink baseband signal obtaining unit 110 is configured to obtain an uplink time-domain baseband signal of a user, where the uplink time-domain baseband signal of the user is a complex signal formed by I/Q components.

A CP removing unit 120 is configured to remove a CP of the uplink time-domain baseband signal of the user to obtain a CP-removed uplink time-domain baseband signal.

A time-frequency transform unit 130 is configured to perform FFT on the CP-removed uplink time-domain baseband signal to transform the CP-removed uplink time-domain baseband signal into an uplink frequency-domain baseband signal.

A resource block demapping unit 140 is configured to perform resource block demapping on the uplink frequency-domain baseband signal to separate a PUSCH signal and an RS from the uplink frequency-domain baseband signal.

An RS channel estimation module 141 is configured to perform channel estimation on the RS to obtain an estimated channel of the RS.

An MIMO detection module 142 is configured to perform MIMO detection on the PUSCH signal according to the estimated channel of the RS to obtain a MIMO-detected PUSCH signal, where the estimated channel of the RS is obtained by the RS channel estimation module.

A frequency-time transform module 150 is configured to perform IDFT on the MIMO-detected PUSCH signal to obtain a time-domain PUSCH signal.

An amplitude/phase conversion module 160 is configured to perform amplitude/phase conversion on the time-domain PUSCH signal to obtain an amplitude signal and a phase signal of the time-domain PUSCH signal; and perform amplitude/phase conversion on the RS to obtain an amplitude signal and a phase signal of the RS.

A quantization module 170 is configured to perform amplitude quantization and phase quantization on the amplitude signal and the phase signal of the time-domain PUSCH signal respectively to obtain a quantized amplitude signal and a quantized phase signal of the time-domain PUSCH signal; and perform amplitude quantization and phase quantization on the amplitude signal and the phase signal of the RS respectively to obtain a quantized amplitude signal and a quantized phase signal of the RS.

Due to a characteristic of a low peak to average power ratio of SC-FDMA, in one embodiment, the amplitude signal may be quantized by using a small number of bits, and the phase signal may be quantized by using an ordinary number of bits.

A transmitting module 180 is configured to transmit the quantized amplitude signal and the quantized phase signal of the time-domain PUSCH signal, and the quantized amplitude signal and the quantized phase signal of the RS.

In one embodiment, during LTE uplink transmission, when an uplink PUSCH adopts QPSK for modulation, an amplitude signal of a PUSCH signal may be quantized by using 7 bits, and a phase signal of the PUSCH signal may be quantized by using 14 bits, to perform compression processing; and an amplitude signal of an RS may be quantized by using 7 bits, and a phase signal of the RS may be quantized by using 14 bits.

When the uplink PUSCH adopts 16QAM for modulation, the amplitude signal of the PUSCH signal may be quantized and compressed by using 9 bits, and the phase signal of the PUSCH signal may be quantized and compressed by using 14 bits; and the amplitude signal of the RS may be quantized by using 7 bits, and the phase signal of the RS may be quantized by using 14 bits.

When the uplink PUSCH adopts 64QAM for modulation, the amplitude signal of the PUSCH signal may be quantized and compressed by using 11 bits, and the phase signal of the PUSCH signal may be quantized and compressed by using 14 bits; and the amplitude signal of the RS may be quantized by using 7 bits, and the phase signal of the RS may be quantized by using 14 bits. An average compression ratio is 20%, so that a transmission bandwidth of a baseband signal can be greatly reduced.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently.

Figure 8:
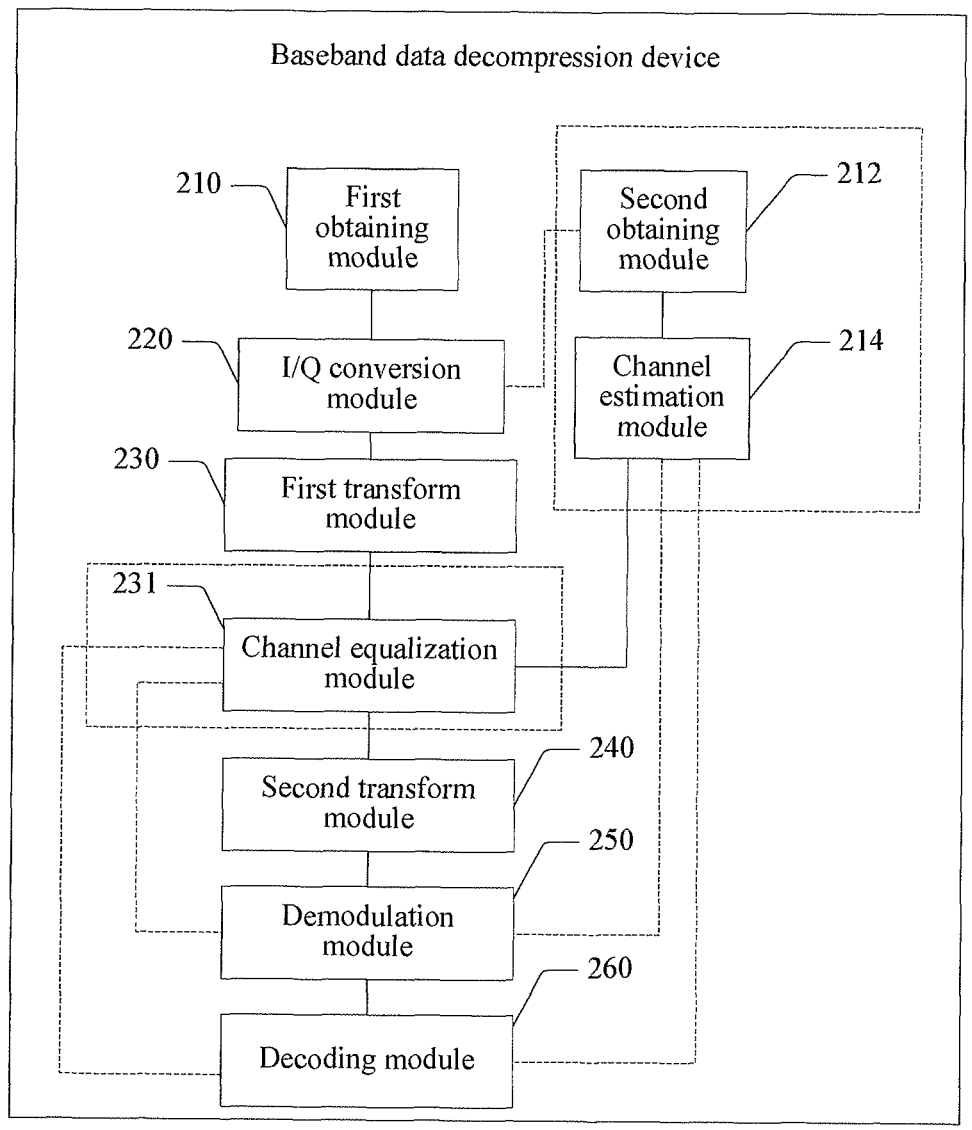
FIG. 8 is a structural diagram of a baseband data decompression device according to an embodiment of the present invention.

Accordingly, in one embodiment, to further improve system performance, an advanced receiver algorithm, such as a Turbo iterative receiver or an MIMO SIC receiver, may be adopted at a BBU side. Therefore, a baseband data decompression device provided in the embodiment of the present invention may flexibly adopt various advanced receiver algorithms. As shown in FIG. 8, an embodiment of the present invention provides a baseband data decompression device, including:

A first obtaining module 210 is configured to obtain a quantized amplitude signal and a quantized phase signal of a time-domain PUSCH signal.

A second obtaining module 212 is configured to obtain a quantized amplitude signal and a quantized phase signal of an RS.

A channel estimation module 214 is configured to perform channel estimation on the quantized amplitude signal and the quantized phase signal of the RS to obtain an estimated signal, where the quantized amplitude signal and the quantized phase signal of the RS are received by the second obtaining module 212.

It should be noted that, the quantized amplitude signal and the quantized phase signal of the time-domain PUSCH signal are transmitted from an RRU in one embodiment.

An I/Q conversion module 220 is configured to perform I/Q conversion on the quantized amplitude signal and the quantized phase signal of the time-domain PUSCH signal to obtain a complex PUSCH signal, where the complex PUSCH signal is a complex signal formed by I/Q components.

A first transform module 230 is configured to perform DFT on the complex PUSCH signal to map the complex PUSCH signal to a frequency domain.

A channel equalization module 231 is configured to perform, by using the estimated signal, channel equalization on the PUSCH signal that undergoes the DFT, to obtain a channel equalized PUSCH signal.

A second transform module 240 is configured to perform IDFT on the channel equalized PUSCH signal to obtain a time-domain PUSCH signal.

A demodulation module 250 is configured to perform constellation demodulation on the time-domain PUSCH signal to obtain demodulated data.

A decoding module 260 is configured to perform channel decoding on the demodulated data to obtain uplink data of a user.

In one embodiment, as shown by dashed lines in FIG. 8, the I/Q conversion module 220 is further configured to perform I/Q conversion on the quantized amplitude signal and the quantized phase signal of the RS to obtain a complex RS, where the complex RS is a complex signal formed by I/Q components; and accordingly, the channel estimation module 214 is specifically configured to perform channel estimation on the complex RS to obtain an estimated signal.

In one embodiment, as shown in FIG. 8, to further improve system performance, the demodulated data may be fed back to the channel estimation module 214, where the demodulated data is obtained after the demodulation module 250 performs constellation demodulation on the time-domain PUSCH signal, to assist the channel estimation module 214 to perform channel estimation; and in one embodiment, to further improve the system performance, the demodulated data may also be fed back to the channel equalization module 231, where the demodulated data is obtained after the demodulation module 250 performs constellation demodulation on the time-domain PUSCH signal, to assist the channel equalization module 231 to perform channel equalization.

In one embodiment, as shown in FIG. 8, to further improve the system performance, the uplink data of the user may be fed back to the channel estimation module 214, where the uplink data of the user is obtained by the decoding module 260, to assist the channel estimation module 214 to perform channel estimation; and in one embodiment, to further improve the system performance, the uplink data of the user may also be fed back to the channel equalization module 231, where the uplink data of the user is obtained by the decoding module 260, to assist the channel equalization module 231 to perform channel equalization.

Figure 23:
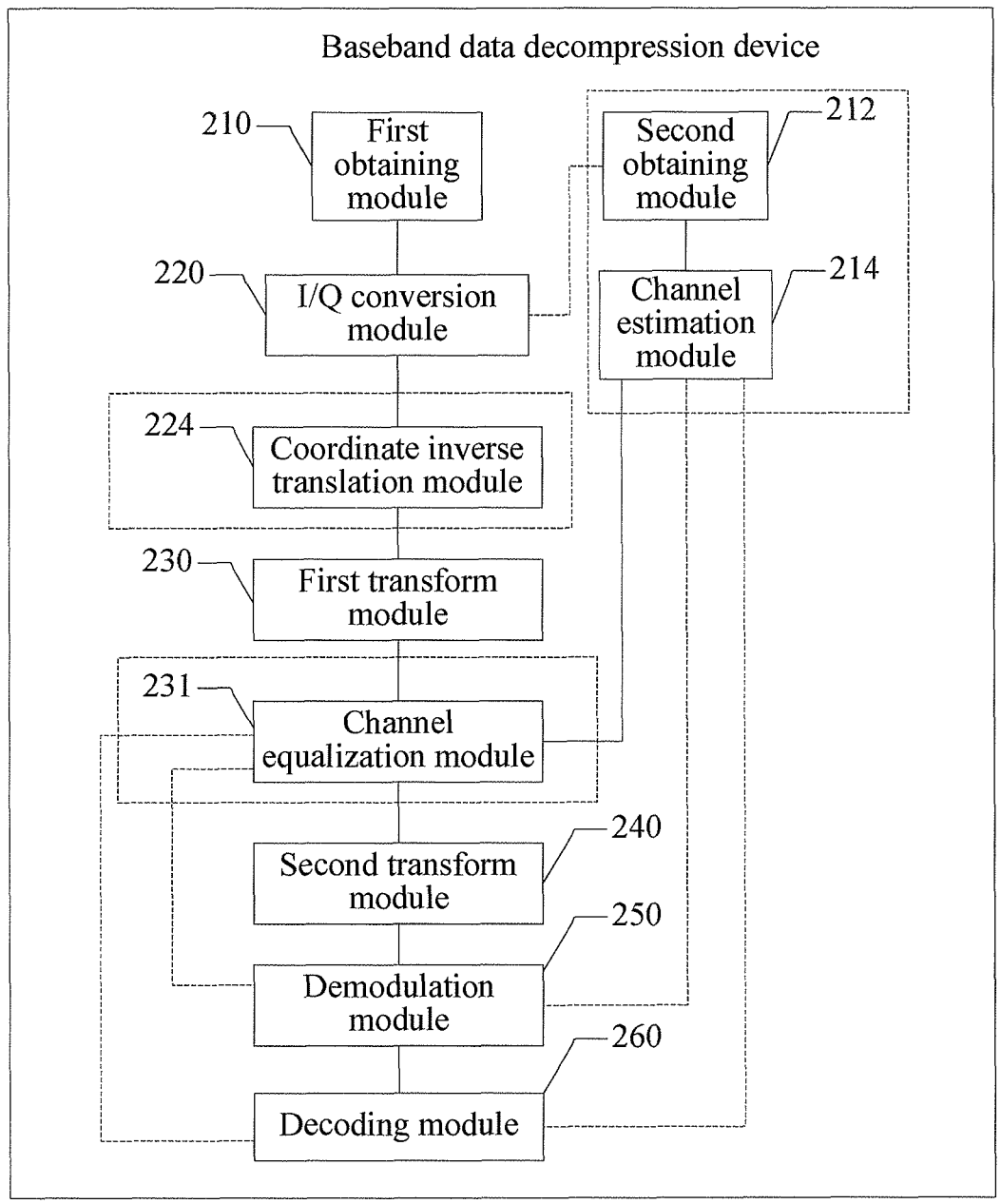
FIG. 23 is a structural diagram of a baseband data decompression device according to an embodiment of the present invention.

In one embodiment, as shown in FIG. 23, when a baseband data compression device translates coordinates of an origin, in addition to the foregoing modules, the baseband data decompression device may further include:

a coordinate inverse translation module 224, configured to reset an origin of coordinates according to a constellation quadrant where the complex PUSCH signal is located.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently; and corresponding decompression processing is adopted at a BBU side to recover data of a user, so that a transmission bandwidth of a baseband signal can be greatly reduced, thereby improving utilization efficiency of a resource.

Figure 24:
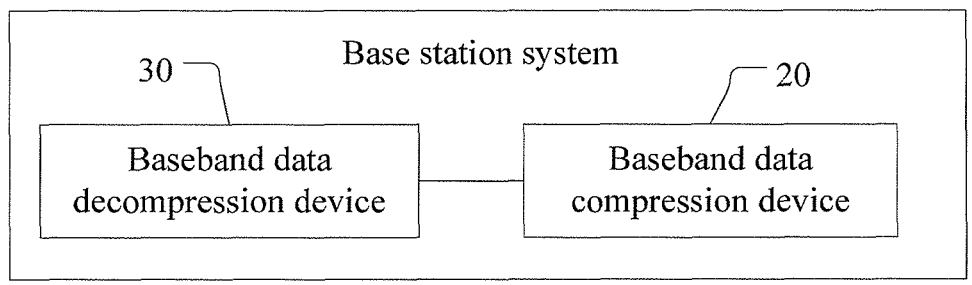
FIG. 24 is a structural diagram of a base station system according to an embodiment of the present invention.

As shown in FIG. 24, an embodiment of the present invention further provides a structural diagram of a base station system, where the base station system includes a baseband data compression device 20 and a baseband data decompression device 30. Specific structures and functions of the baseband data compression device 20 and the baseband data decompression device 30 have been described in detail in the foregoing embodiments, which are not described here again.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently; and corresponding decompression processing is adopted at a BBU side to recover data of a user, so that a transmission bandwidth of a baseband signal can be greatly reduced, thereby improving utilization efficiency of a resource.

Figure 26:
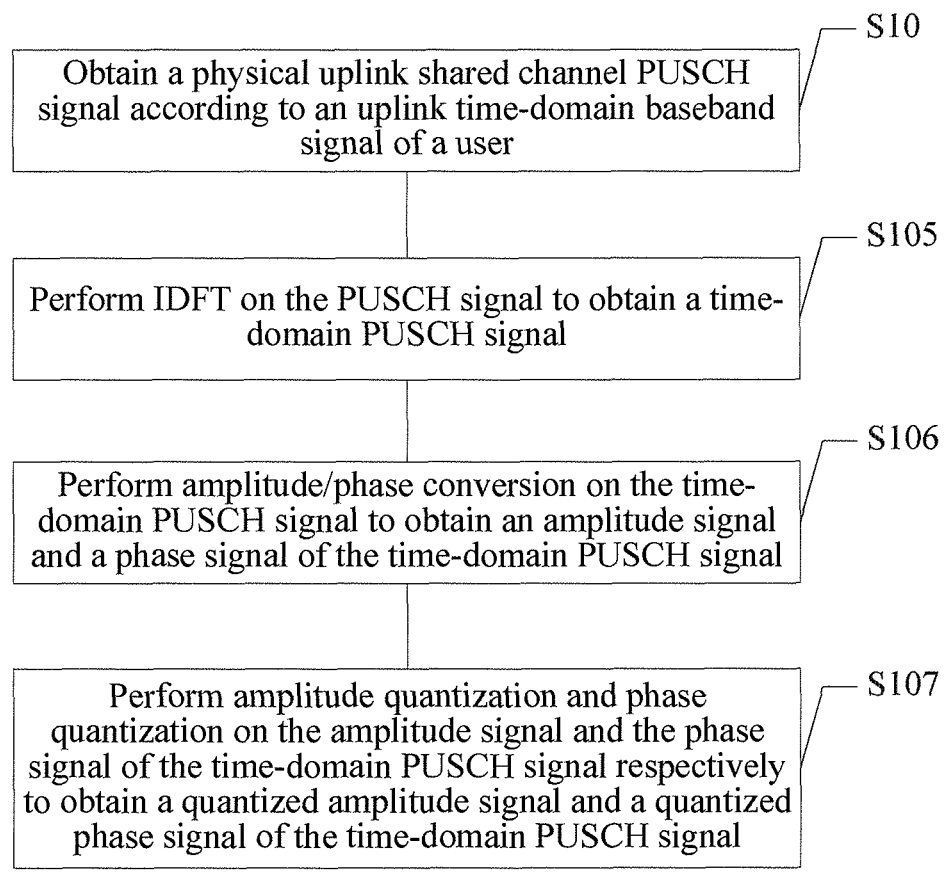
FIG. 26 is a flow chart of an uplink baseband signal compression method according to an embodiment of the present invention.

As shown in FIG. 26, an embodiment of the present invention provides an uplink baseband signal compression method. The method includes:

S10: Obtain a physical uplink shared channel PUSCH signal according to an uplink time-domain baseband signal of a user.

S105: Perform inverse discrete Fourier transform IDFT on the PUSCH signal to obtain a time-domain PUSCH signal.

S106: Perform amplitude/phase conversion on the time-domain PUSCH signal to obtain an amplitude signal and a phase signal of the time-domain PUSCH signal.

S107: Perform amplitude quantization and phase quantization on the amplitude signal and the phase signal of the time-domain PUSCH signal respectively to obtain a quantized amplitude signal and a quantized phase signal of the time-domain PUSCH signal.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently; and corresponding decompression processing is adopted at a BBU side to recover data of a user, so that a transmission bandwidth of a baseband signal can be greatly reduced, thereby improving utilization efficiency of a resource.

Figure 9:
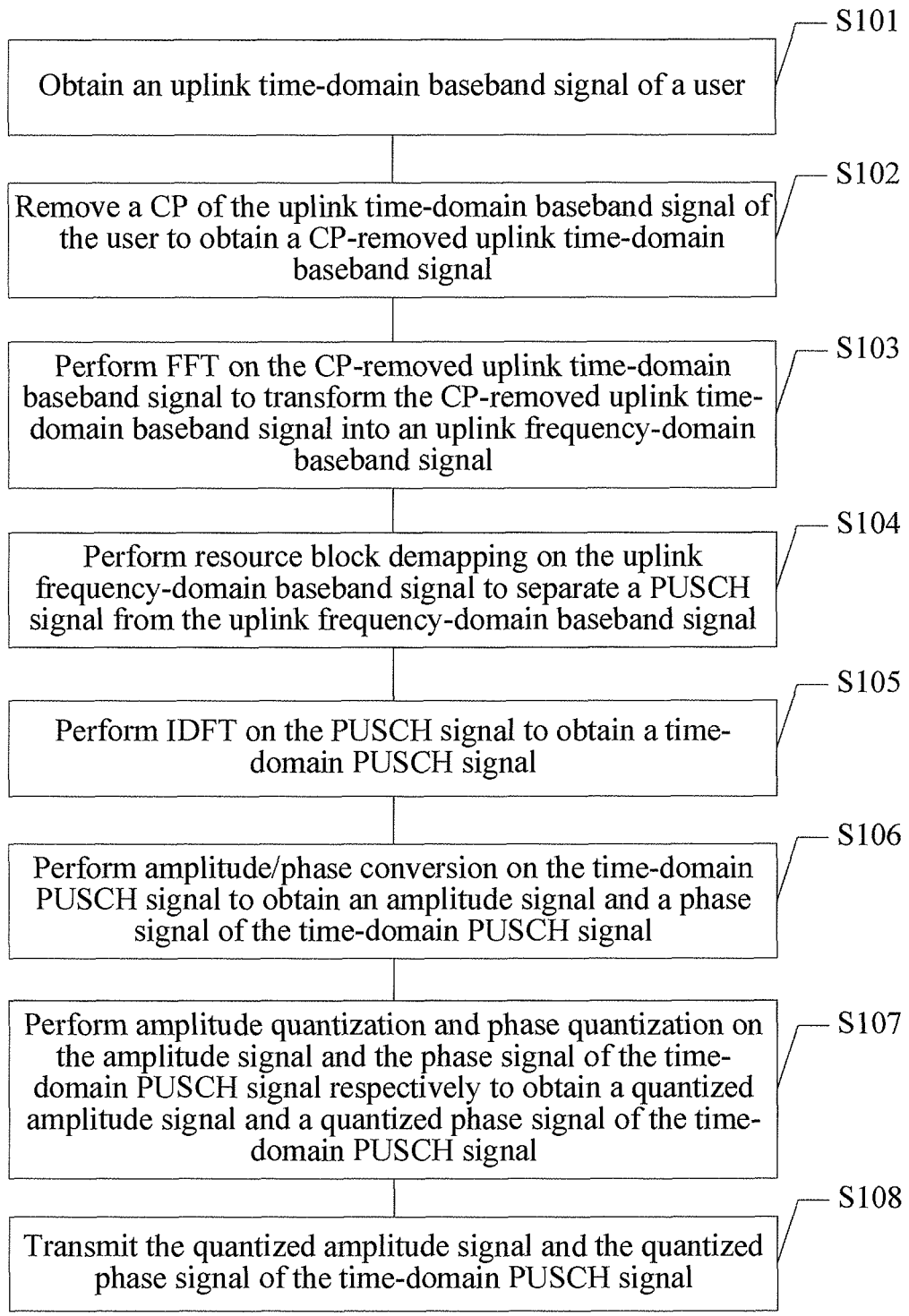
FIG. 9 is a flowchart of an uplink baseband signal compression method according to an embodiment of the present invention.

As shown in FIG. 9, an embodiment of the present invention provides an uplink baseband signal compression method. The method includes:

S101: Obtain an uplink time-domain baseband signal of a user, where the uplink time-domain baseband signal of the user is a complex signal formed by I/Q components.

S102: Remove a CP of the uplink time-domain baseband signal of the user to obtain a CP-removed uplink time-domain baseband signal.

S103: Perform FFT on the CP-removed uplink time-domain baseband signal to transform the CP-removed uplink time-domain baseband signal into an uplink frequency-domain baseband signal.

S104: Perform resource block demapping on the uplink frequency-domain baseband signal to separate a PUSCH signal from the uplink frequency-domain baseband signal.

In one embodiment, resource block demapping may also be performed on the uplink frequency-domain baseband signal to separate a physical uplink control channel PUCCH, an uplink demodulation reference signal RS and an uplink Sounding reference signal from the uplink frequency-domain baseband signal.

S105: Perform IDFT on the PUSCH signal to obtain a time-domain PUSCH signal.

S106: Perform amplitude/phase conversion on the time-domain PUSCH signal to obtain an amplitude signal and a phase signal of the time-domain PUSCH signal.

S107: Perform amplitude quantization and phase quantization on the amplitude signal and the phase signal of the time-domain PUSCH signal respectively to obtain a quantized amplitude signal and a quantized phase signal of the time-domain PUSCH signal.

Due to a characteristic of a low peak to average power ratio of SC-FDMA, in one embodiment, the amplitude signal may be quantized by using a small number of bits, and the phase signal may be quantized by using an ordinary number of bits.

S108: Transmit the quantized amplitude signal and the quantized phase signal of the time-domain PUSCH signal.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently.

Further, in one embodiment, since resource block demapping is performed on the uplink frequency-domain baseband signal, a physical uplink control channel PUCCH, an uplink reference signal RS, and an uplink Sounding reference signal may also be separated from the uplink frequency-domain baseband signal. Since the uplink reference signal RS adopts a constant envelope sequence, compression processing may also be performed on the RS.

Figure 10:
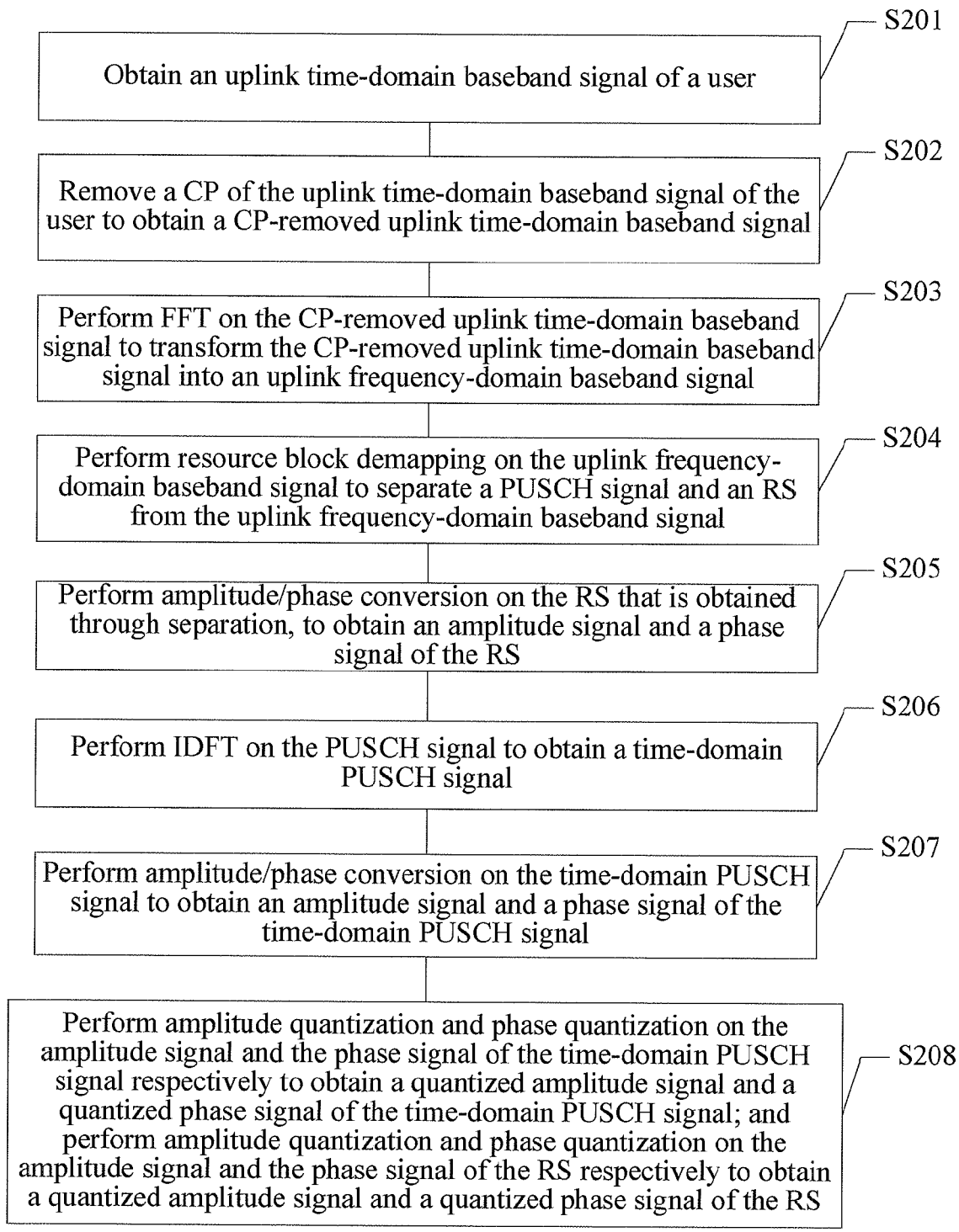
FIG. 10 is a flow chart of an uplink baseband signal compression method according to an embodiment of the present invention.

As shown in FIG. 10, in one embodiment, an LTE uplink baseband signal compression method is provided. The method includes:

S201: Obtain an uplink time-domain baseband signal of a user, where the uplink time-domain baseband signal of the user is a complex signal formed by I/Q components.

S202: Remove a CP of the uplink time-domain baseband signal of the user to obtain a CP-removed uplink time-domain baseband signal.

S203: Perform FFT on the CP-removed uplink time-domain baseband signal to transform the CP-removed uplink time-domain baseband signal into an uplink frequency-domain baseband signal.

S204: Perform resource block demapping on the uplink frequency-domain baseband signal to separate a PUSCH signal and an RS from the uplink frequency-domain baseband signal.

In one embodiment, resource block demapping may also be performed on the uplink frequency-domain baseband signal to separate an uplink Sounding reference signal from the uplink frequency-domain baseband signal.

S205: Perform amplitude/phase conversion on the RS that is obtained through separation, to obtain an amplitude signal and a phase signal of the RS.

S206: Perform IDFT on the PUSCH signal to obtain a time-domain PUSCH signal.

S207: Perform amplitude/phase conversion on the time-domain PUSCH signal to obtain an amplitude signal and a phase signal of the time-domain PUSCH signal.

S208: Perform amplitude quantization and phase quantization on the amplitude signal and the phase signal of the time-domain PUSCH signal respectively to obtain a quantized amplitude signal and a quantized phase signal of the time-domain PUSCH signal; and perform amplitude quantization and phase quantization on the amplitude signal and the phase signal of the RS respectively to obtain a quantized amplitude signal and a quantized phase signal of the RS.

Due to a characteristic of a low peak to average power ratio of SC-FDMA, in one embodiment, the amplitude signal may be quantized by using a small number of bits, and the phase signal may be quantized by using an ordinary number of bits.

S209: Transmit the quantized amplitude signal and the quantized phase signal of the time-domain PUSCH signal and the quantized amplitude signal and the quantized phase signal of the RS.

In one embodiment, to reduce a quantization range and further improve a compression ratio, the following step may further be included before S207:

translating, according to a constellation quadrant where the time-domain PUSCH signal is located, an origin of coordinates to a preset position in the constellation quadrant where the time-domain PUSCH signal is located, and obtaining coordinates of the time-domain PUSCH signal after the origin of coordinates is translated; where accordingly, S207 specifically includes:

performing amplitude/phase conversion on the time-domain PUSCH signal according to the coordinates of the time-domain PUSCH signal, where the coordinates of the time-domain PUSCH signal are obtained after the origin of coordinates is translated, to obtain an amplitude signal and a phase signal of the time-domain PUSCH signal.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, and in this way, a baseband signal can be compressed efficiently, so that a transmission bandwidth of a baseband signal can be greatly reduced, and utilization efficiency of a resource can be improved.

Figure 11:
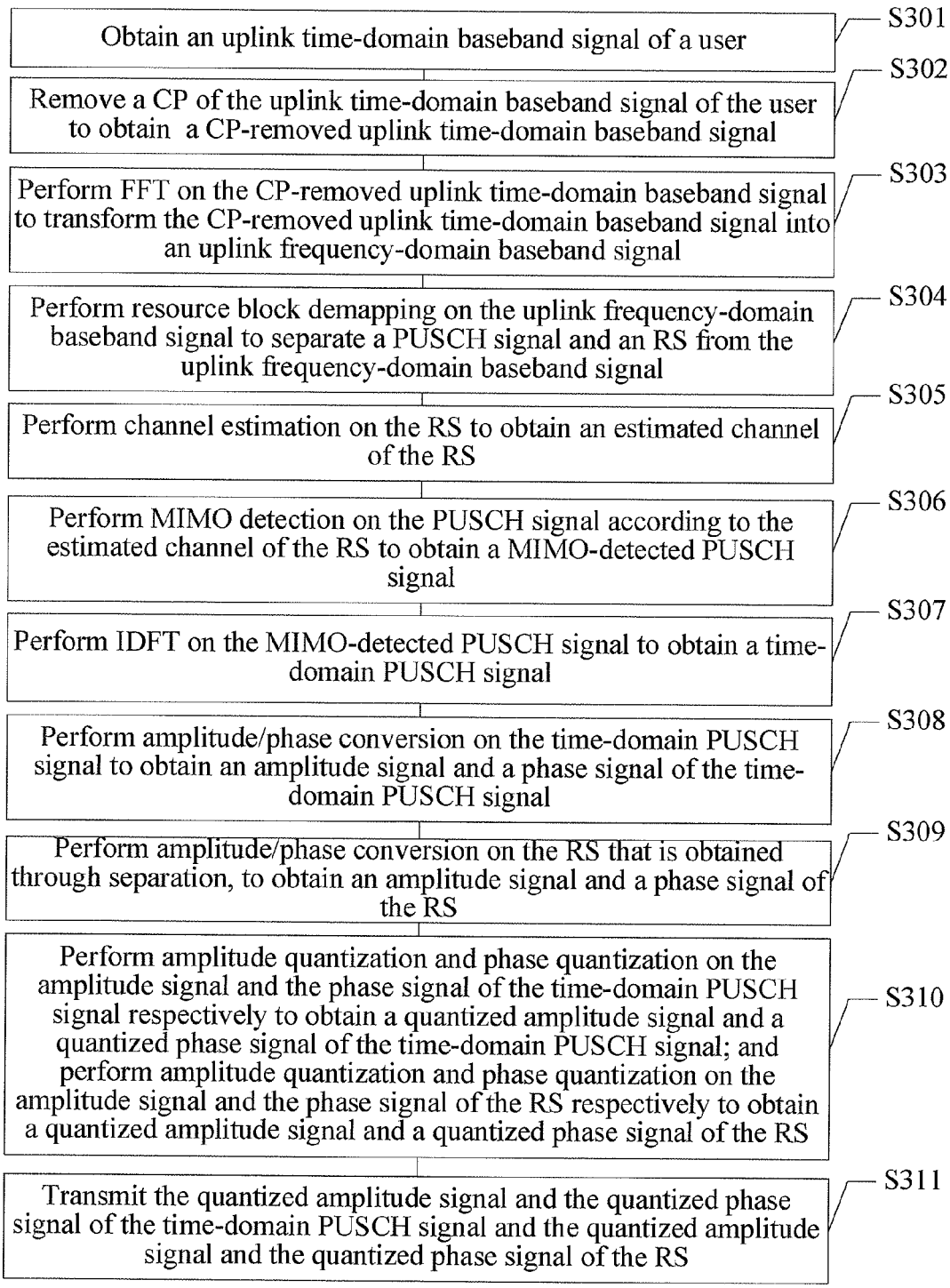
FIG. 11 is a flow chart of an uplink baseband signal compression method according to an embodiment of the present invention.

In one embodiment, MIMO transmission or virtual MIMO transmission may be adopted in uplink, and at this time, as shown in FIG. 11, an embodiment of the present invention provides an LTE uplink baseband signal compression method. The method includes:

S301: Obtain an uplink time-domain baseband signal of a user, where the uplink time-domain baseband signal of the user is a complex signal formed by I/Q components.

S302: Remove a CP of the uplink time-domain baseband signal of the user to obtain a CP-removed uplink time-domain baseband signal.

S303: Perform FFT on the CP-removed uplink time-domain baseband signal to transform the CP-removed uplink time-domain baseband signal into an uplink frequency-domain baseband signal.

S304: Perform resource block demapping on the uplink frequency-domain baseband signal to separate a PUSCH signal and an RS from the uplink frequency-domain baseband signal.

In one embodiment, resource block demapping may also be performed on the uplink frequency-domain baseband signal to separate an uplink Sounding reference signal from the uplink frequency-domain baseband signal.

S305: Perform channel estimation on the RS to obtain an estimated channel of the RS.

S306: Perform MIMO detection on the PUSCH signal according to the estimated channel of the RS to obtain a MIMO-detected PUSCH signal.

S307: Perform IDFT on the MIMO-detected PUSCH signal to obtain a time-domain PUSCH signal.

S308: Perform amplitude/phase conversion on the time-domain PUSCH signal to obtain an amplitude signal and a phase signal of the time-domain PUSCH signal.

S309: Perform amplitude/phase conversion on the RS that is obtained through separation, to obtain an amplitude signal and a phase signal of the RS.

S310: Perform amplitude quantization and phase quantization on the amplitude signal and the phase signal of the time-domain PUSCH signal respectively to obtain a quantized amplitude signal and a quantized phase signal of the time-domain PUSCH signal; and perform amplitude quantization and phase quantization on the amplitude signal and the phase signal of the RS respectively to obtain a quantized amplitude signal and a quantized phase signal of the RS.

Due to a characteristic of a low peak to average power ratio of SC-FDMA, in one embodiment, the amplitude signal may be quantized by using a small number of bits, and the phase signal may be quantized by using an ordinary number of bits.

S311: Transmit the quantized amplitude signal and the quantized phase signal of the time-domain PUSCH signal and the quantized amplitude signal and the quantized phase signal of the RS.

In one embodiment, during LTE uplink transmission, when an uplink PUSCH adopts QPSK modulation, an amplitude signal of a PUSCH signal may be quantized by using 7 bits, and a phase signal of the PUSCH signal may be quantized by using 14 bits, to perform compression processing; and an amplitude signal of an RS may be quantized by using 7 bits, and a phase signal of the RS may be quantized by using 14 bits.

When the uplink PUSCH adopts 16QAM for modulation, the amplitude signal of the PUSCH signal may be quantized and compressed by using 9 bits, and the phase signal of the PUSCH signal may be quantized and compressed by using 14 bits; and the amplitude signal of the RS may be quantized by using 7 bits, and the phase signal of the RS may be quantized by using 14 bits.

When the uplink PUSCH adopts 64QAM for modulation, the amplitude signal of the PUSCH signal may be quantized and compressed by using 11 bits, and the phase signal of the PUSCH signal may be quantized and compressed by using 14 bits; and the amplitude signal of the RS may be quantized by using 7 bits, and the phase signal of the RS may be quantized by using 14 bits. An average compression ratio is 20%, so that a transmission bandwidth of a baseband signal can be greatly reduced.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, and in this way, a baseband signal can be compressed efficiently, so that a transmission bandwidth of a baseband signal can be greatly reduced, and utilization efficiency of a resource can be improved.

Figure 12:
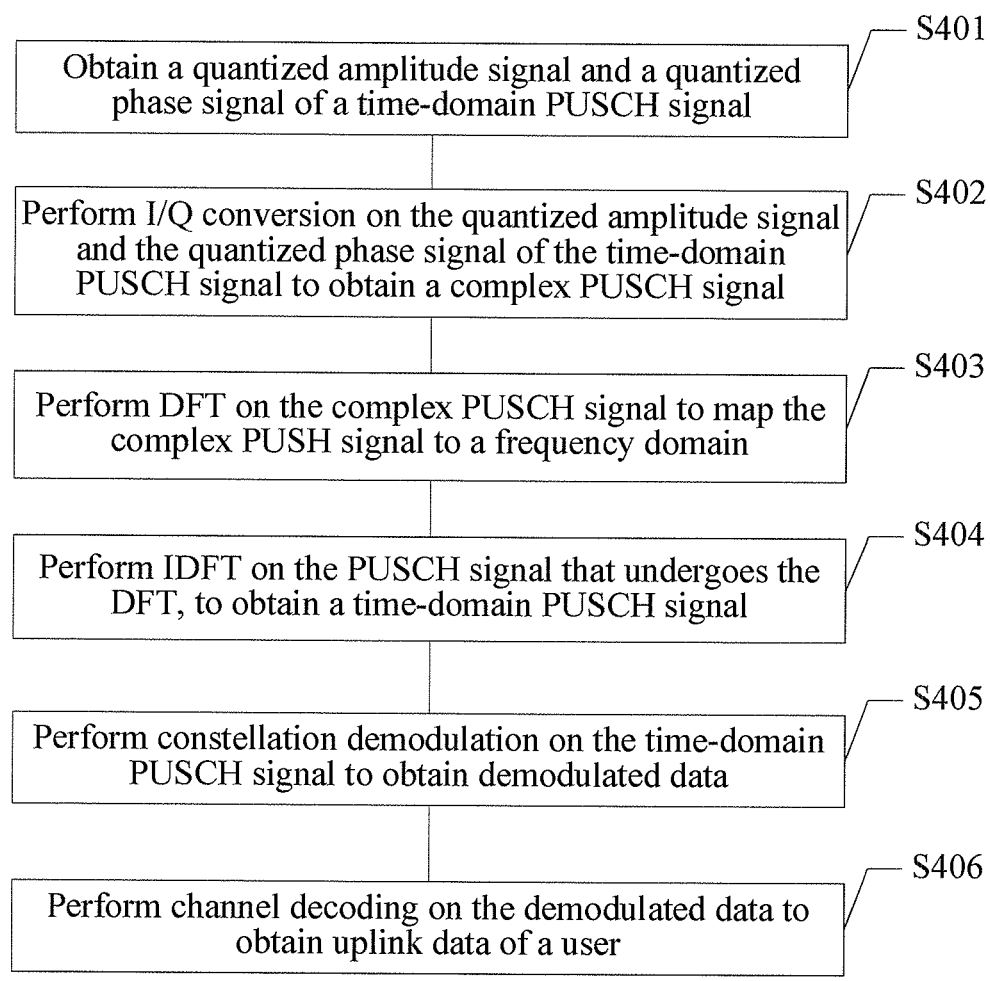
FIG. 12 is a flow chart of an uplink baseband signal decompression method according to an embodiment of the present invention.

As shown in FIG. 12, an embodiment of the present invention provides an LTE uplink baseband signal decompression method, where the method includes:

S401: Obtain a quantized amplitude signal and a quantized phase signal of a time-domain PUSCH signal.

It should be noted that, the quantized amplitude signal and the quantized phase signal of the time-domain PUSCH signal are transmitted from an RRU in one embodiment.

S402: Perform I/Q conversion on the quantized amplitude signal and the quantized phase signal of the time-domain PUSCH signal to obtain a complex PUSCH signal, where the complex PUSCH signal is a complex signal formed by I/Q components.

S403: Perform DFT on the complex PUSCH signal to map the complex PUSCH signal to a frequency domain.

S404: Perform IDFT on the PUSCH signal that undergoes the DFT, to obtain a time-domain PUSCH signal.

S405: Perform constellation demodulation on the time-domain PUSCH signal to obtain demodulated data.

S406: Perform channel decoding on the demodulated data to obtain uplink data of a user.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently; and corresponding decompression processing is adopted at a BBU side to recover data of a user, so that a transmission bandwidth of a baseband signal can be greatly reduced, thereby improving utilization efficiency of a resource.

Figure 13A:
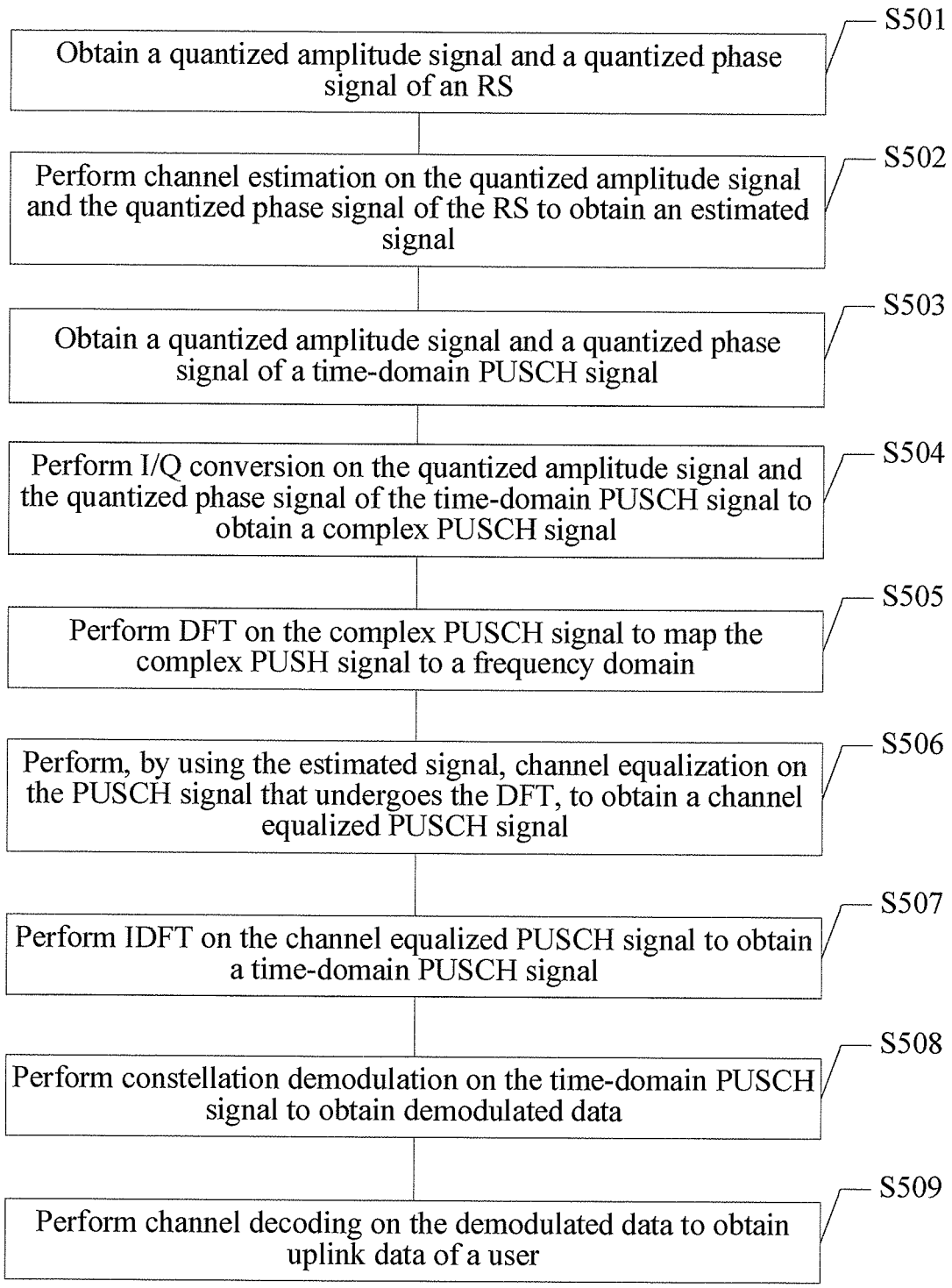
FIG. 13a is a flow chart of an uplink baseband signal decompression method according to an embodiment of the present invention.

In one embodiment, to further improve system performance, an advanced receiver algorithm, such as a Turbo iterative receiver or an MIMO SIC receiver, may be adopted at a BBU side. A EMU provided in this embodiment of the present invention may flexibly adopt various advanced receiver algorithms. As shown in FIG. 13a, an embodiment of the present invention provides an LTE uplink baseband signal decompression method, where the method includes:

S501: Obtain a quantized amplitude signal and a quantized phase signal of an RS.

S502: Perform channel estimation on the quantized amplitude signal and the quantized phase signal of the RS to obtain an estimated signal.

S503: Obtain a quantized amplitude signal and a quantized phase signal of a time-domain PUSCH signal.

It should be noted that, the quantized amplitude signal and the quantized phase signal of the time-domain PUSCH signal are transmitted from an RRU in one embodiment.

S504: Perform I/Q conversion on the quantized amplitude signal and the quantized phase signal of the time-domain PUSCH signal to obtain a complex PUSCH signal, where the complex PUSCH signal is a complex signal formed by I/Q components.

S505: Perform DFT on the complex PUSCH signal to map the complex PUSCH signal to a frequency domain.

S506: Perform, by using the estimated signal, channel equalization on the PUSCH signal that undergoes the DFT, to obtain a channel equalized PUSCH signal.

S507: Perform IDFT on the channel equalized PUSCH signal to obtain a time-domain PUSCH signal.

S508: Perform constellation demodulation on the time-domain PUSCH signal to obtain demodulated data.

S509: Perform channel decoding on the demodulated data to obtain uplink data of a user.

Figure 13B:
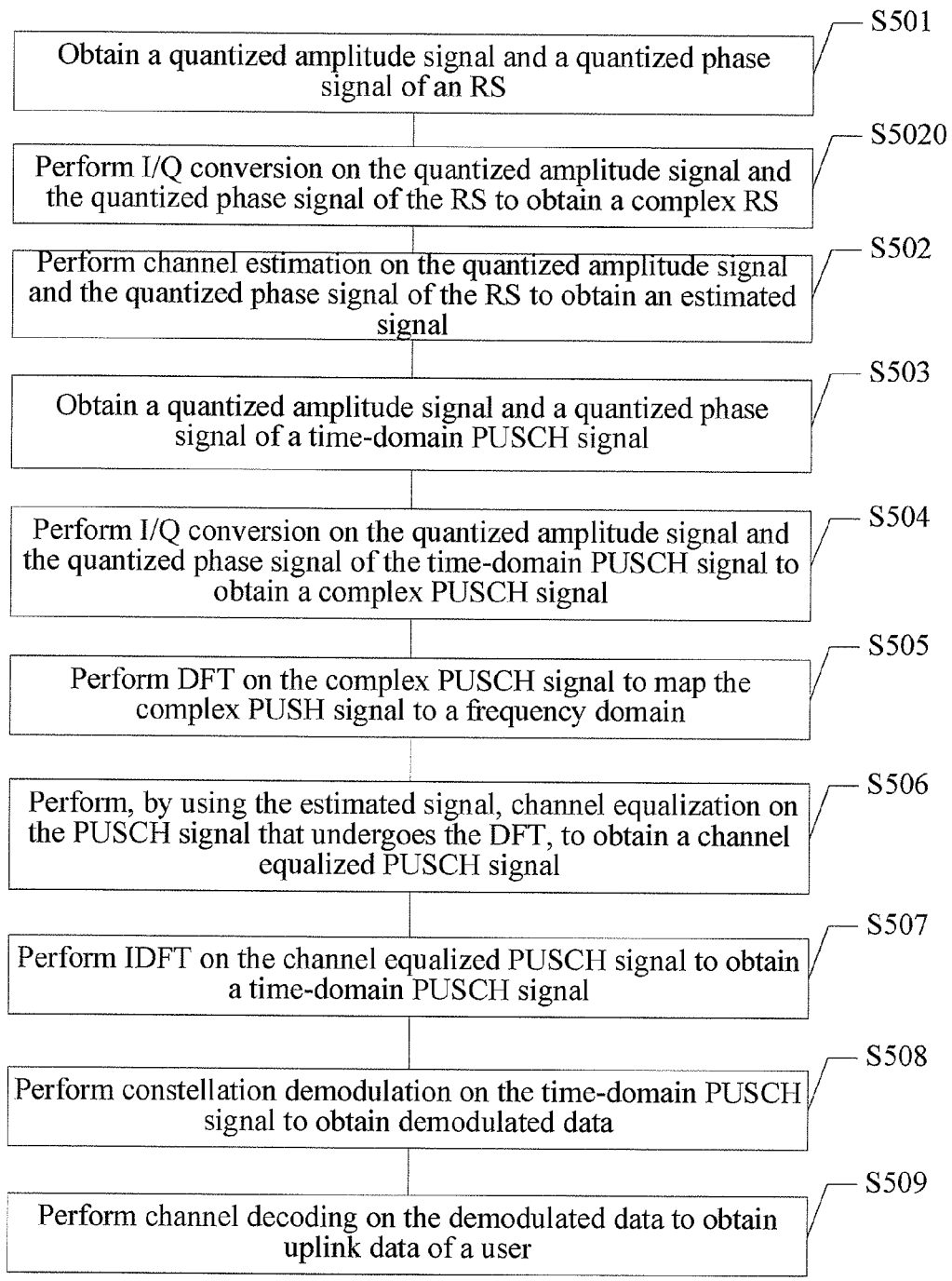
FIG. 13b is a flow chart of an uplink baseband signal decompression method according to an embodiment of the present invention.

In one embodiment, as shown in FIG. 13b, before step S502, the method further includes:

S5020: Perform I/Q conversion on the quantized amplitude signal and the quantized phase signal of the RS to obtain a complex RS, where the complex RS is a complex signal formed by I/Q components.

Step S502 specifically includes: performing channel estimation on the complex RS to obtain an estimated signal.

In one embodiment, to further improve system performance, data obtained after constellation demodulation in S508 or data obtained after channel decoding in S509 may be fed back to assist channel estimation in S502 or S5020 or channel equalization in S506.

In one embodiment, when an RRU side translates coordinates of an origin, the method may further include the following step:

resetting an origin of coordinates according to a constellation quadrant where the complex PUSCH signal is located.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal is represented by using amplitude and phase, and then amplitude quantization and phase quantization are performed respectively to obtain a quantized amplitude signal and a quantized phase signal respectively, so that a baseband signal can be compressed efficiently; and corresponding decompression processing is adopted at a BBU side to recover data of a user, so that a transmission bandwidth of a baseband signal can be greatly reduced, thereby improving utilization efficiency of a resource.

The solutions provided in the embodiments of the present invention are described for different modulation modes in the following with reference to specific modulation modes adopted in an LTE system.

According to an LTE protocol, in one embodiment, when QPSK modulation is adopted, QPSK modulation symbols x=I+jQ, as shown in Table 1:

TABLE 1

QPSK modulation mapping table

| b(i), b(i + 1) | I | Q |
| --- | --- | --- |
| 00 | $1/\sqrt{2}$ | $1/\sqrt{2}$ |
| 01 | $1/\sqrt{2}$ | $-1/\sqrt{2}$ |
| 10 | $-1/\sqrt{2}$ | $1/\sqrt{2}$ |
| 11 | $-1/\sqrt{2}$ | $-1/\sqrt{2}$ |

Figure 20:
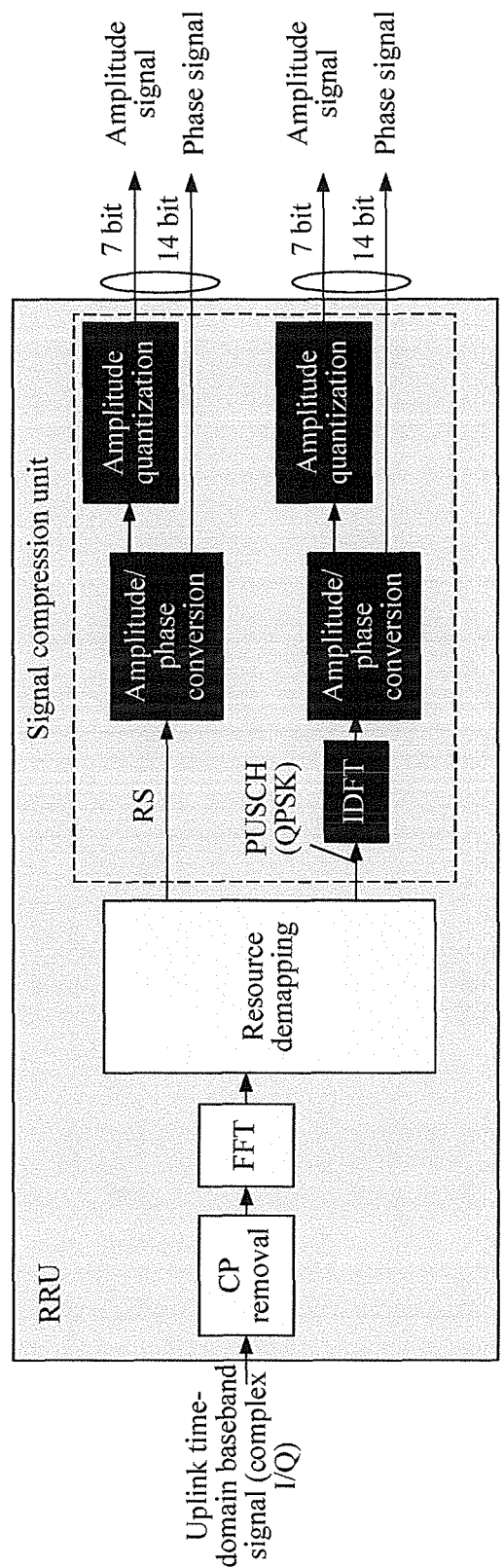
FIG. 20 is a schematic diagram of an uplink baseband signal compression method according to an embodiment of the present invention.

It can be seen that, QPSK modulation symbols are four points on a unit circle, characterized by having the same amplitude, and therefore, when the PUSCH adopts QPSK modulation, a processing method shown in FIG. 20 is adopted.

At an RRU side, after receiving an uplink time-domain baseband signal (the uplink time-domain baseband signal is a complex signal formed by I/Q components), the RRU removes a cyclic prefix CP, performs FFT to transform the signal to a frequency domain, and performs resource block demapping on a frequency-domain signal to separate a reference signal RS and a PUSCH signal. Amplitude/phase conversion is performed on the reference signal RS to obtain an amplitude signal and a phase signal of the RS (that is, amplitude and phase of the RS), the amplitude signal of the RS is quantized by using 7 bits to obtain a quantized amplitude signal of the RS, and the phase signal of the RS is quantized by using 14 bits to obtain a quantized phase signal of the RS.

IDFT transform is performed on the PUSCH signal after resource block demapping to obtain a time-domain PUSCH signal, amplitude/phase conversion is performed on the time-domain PUSCH signal to obtain an amplitude signal and a phase signal of the time-domain PUSCH signal (that is, amplitude and phase of the PUSCH), the amplitude signal of the time-domain PUSCH signal is quantized by using 7 bits to obtain a quantized amplitude signal of the time-domain PUSCH signal, and the phase signal of the time-domain PUSCH signal is quantized by using 14 bits to obtain a quantized phase signal of the time-domain PUSCH signal.

Figure 21:
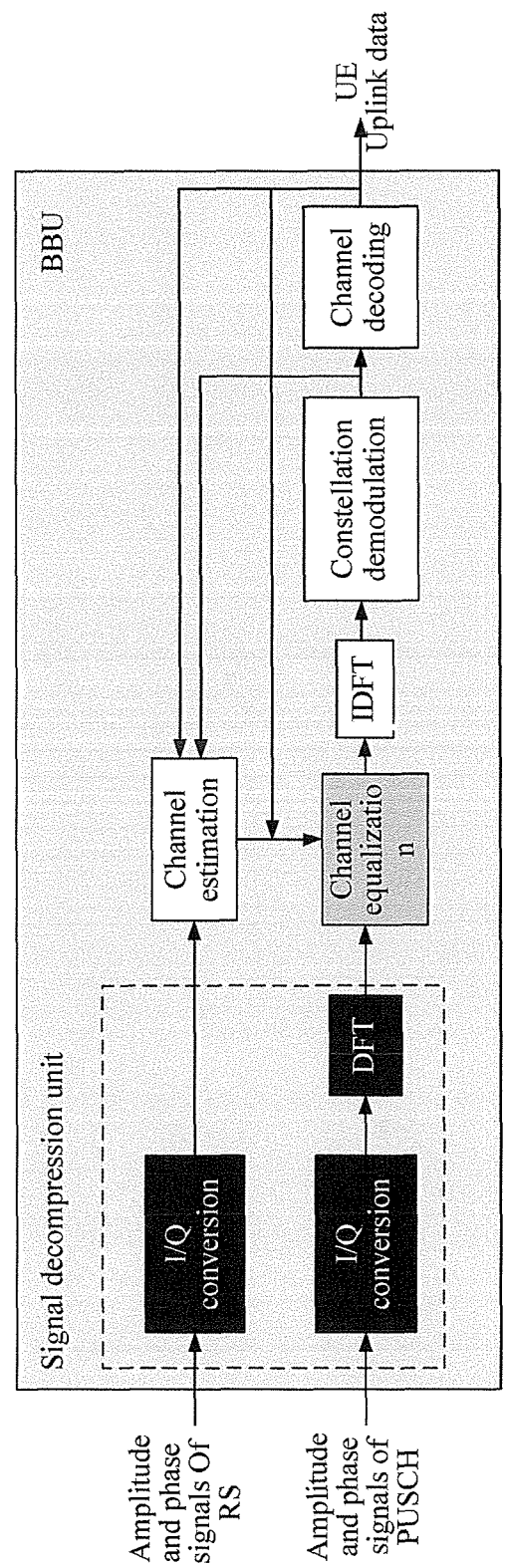
FIG. 21 is a schematic diagram of an uplink baseband signal decompression method according to an embodiment of the present invention.

At a BBU side, the BBU receives amplitude and phase signals of the RS (that is, the quantized amplitude signal of the RS and the quantized phase signal of the RS) and amplitude and phase signals of the PUSCH (that is, the quantized amplitude signal of the time-domain PUSCH signal and the quantized phase signal of the time-domain PUSCH signal) from the RRU, a processing procedure of which is shown in FIG. 21.

I/Q conversion is performed on the quantized amplitude signal and the quantized phase signal of the RS to obtain a complex RS (the complex RS is a complex signal formed by I/Q components, that is, an RS I/Q complex signal), channel estimation is performed by using the signal, I/Q conversion is performed on the amplitude and phase signals of the PUSCH to obtain a complex PUSCH signal (the complex PUSCH signal is a complex signal formed by I/Q components, also called PUSCH I/Q complex signal), DFT transform is performed, channel equalization processing is performed by using a channel, where the channel is obtained through estimation by using the RS, and IDFT transform, constellation demodulation and channel decoding are performed on channel equalized data to obtain uplink data of a user. To further improve system performance, data obtained after constellation demodulation or data obtained after channel decoding may be fed back to assist channel estimation or channel equalization.

According to an LTE protocol, in one embodiment, when 16QAM modulation is adopted, 16QAM modulation symbols x=I+jQ, as shown in Table 2:

TABLE 2

16QAM modulation mapping table

| b(i), b(i + 1), b(i + 2), b(i + 3) | I | Q |
| --- | --- | --- |
| 0000 | $1/\sqrt{10}$ | $1/\sqrt{10}$ |
| 0001 | $1/\sqrt{10}$ | $3/\sqrt{10}$ |
| 0010 | $3/\sqrt{10}$ | $1/\sqrt{10}$ |
| 0011 | $3/\sqrt{10}$ | $3/\sqrt{10}$ |
| 0100 | $1/\sqrt{10}$ | $-1/\sqrt{10}$ |
| 0101 | $1/\sqrt{10}$ | $-3/\sqrt{10}$ |
| 0110 | $3/\sqrt{10}$ | $-1/\sqrt{10}$ |
| 0111 | $3/\sqrt{10}$ | $-3/\sqrt{10}$ |
| 1000 | $-1/\sqrt{10}$ | $1/\sqrt{10}$ |
| 1001 | $-1/\sqrt{10}$ | $3/\sqrt{10}$ |
| 1010 | $-3/\sqrt{10}$ | $1/\sqrt{10}$ |
| 1011 | $-3/\sqrt{10}$ | $3/\sqrt{10}$ |

TABLE 2-continued

16QAM modulation mapping table

| b(i), b(i + 1), b(i + 2), b(i + 3) | I | Q |
|---|---|---|
| 1100 | $-1/\sqrt{10}$ | $-1/\sqrt{10}$ |
| 1101 | $-1/\sqrt{10}$ | $-3/\sqrt{10}$ |
| 1110 | $-3/\sqrt{10}$ | $-1/\sqrt{10}$ |
| 1111 | $-3/\sqrt{10}$ | $-3/\sqrt{10}$ |

Figure 14:
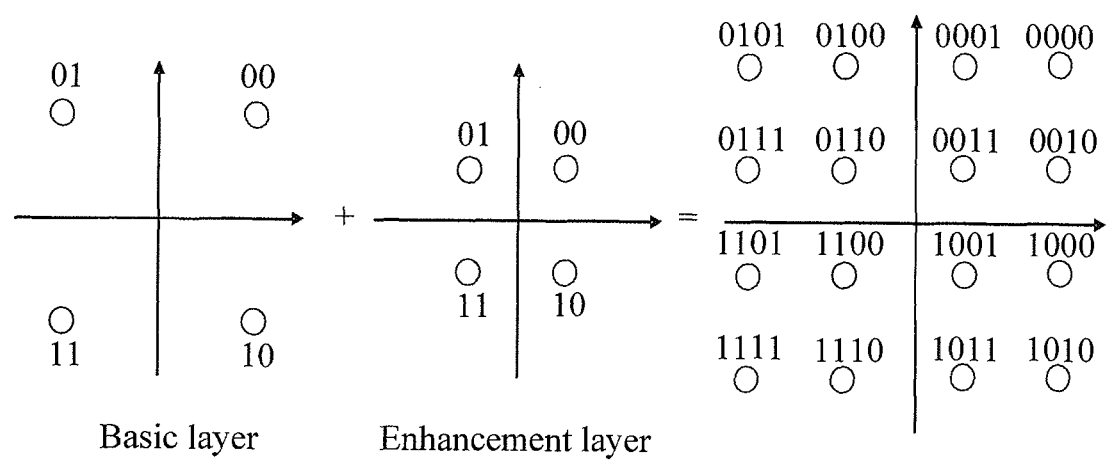
FIG. 14 is a superimposition schematic diagram of a 16QAM constellation according to an embodiment of the present invention.

If represented by a two-dimensional I/Q plane, 16QAM may be represented as superimposition of two QPSK (first QPSK and second QPSK), as shown in a superimposition schematic diagram of a 16QAM constellation provided in FIG. 14.

Figure 18:
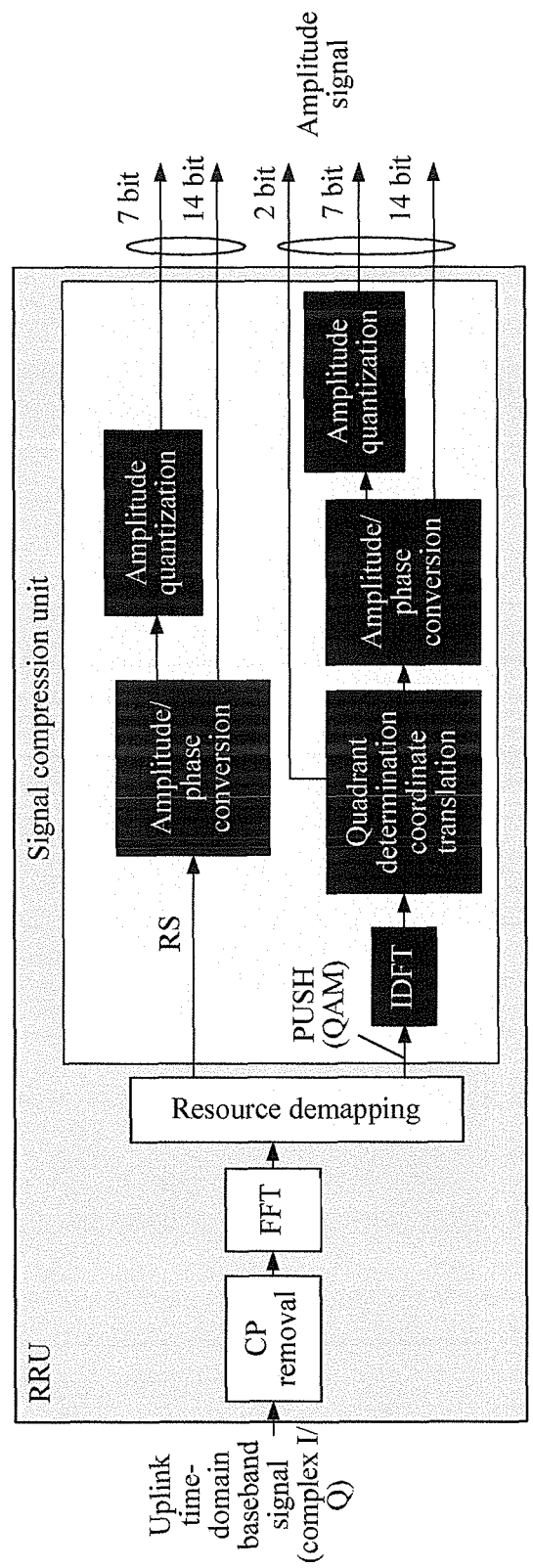
FIG. 18 is a schematic diagram of an uplink baseband signal compression method according to an embodiment of the present invention.

The first QPSK represents a quadrant (a basic layer in FIG. 14) where a constellation point is located, and the second QPSK (an enhancement layer in FIG. 14) represents a specific position of a constellation point in the quadrant indicated by the first QPSK. With reference to the compression method for QPSK, an embodiment of the present invention provides a compression method for 16QAM, as shown in FIG. 18.

At an RRU side, after receiving an uplink time-domain baseband signal (the uplink time-domain baseband signal is a complex signal formed by I/Q components), the RRU removes a cyclic prefix CP, performs FFT to transform the signal to a frequency domain, and performs resource block demapping on a frequency-domain signal to separate a reference signal RS and a PUSCH signal. Amplitude/phase conversion is performed on the reference signal RS to obtain an amplitude signal and a phase signal of the RS (that is, amplitude and phase of the RS), the amplitude signal of the RS is quantized by using 7 bits to obtain a quantized amplitude signal of the RS, and the phase signal of the RS is quantized by using 14 bits to obtain a quantized phase signal of the RS.

IDFT transform is performed on the PUSCH signal after resource block demapping to obtain a time-domain PUSCH signal (the time-domain PUSCH signal is an I/Q signal modulated by adopting 16QAM), a quadrant of the time-domain PUSCH signal is represented by using 2 bits, coordinate translation is performed according to the quadrant, then amplitude/phase conversion is performed on the signal after constellation translation to obtain an amplitude signal and a phase signal of the time-domain PUSCH signal (that is, amplitude and phase of the PUSCH), the amplitude signal of the time-domain PUSCH signal is quantized by using 7 bits to obtain a quantized amplitude signal of the time-domain PUSCH signal, and the phase signal of the time-domain PUSCH signal is quantized by using 14 bits to obtain a quantized phase signal of the time-domain PUSCH signal.

Figure 15:
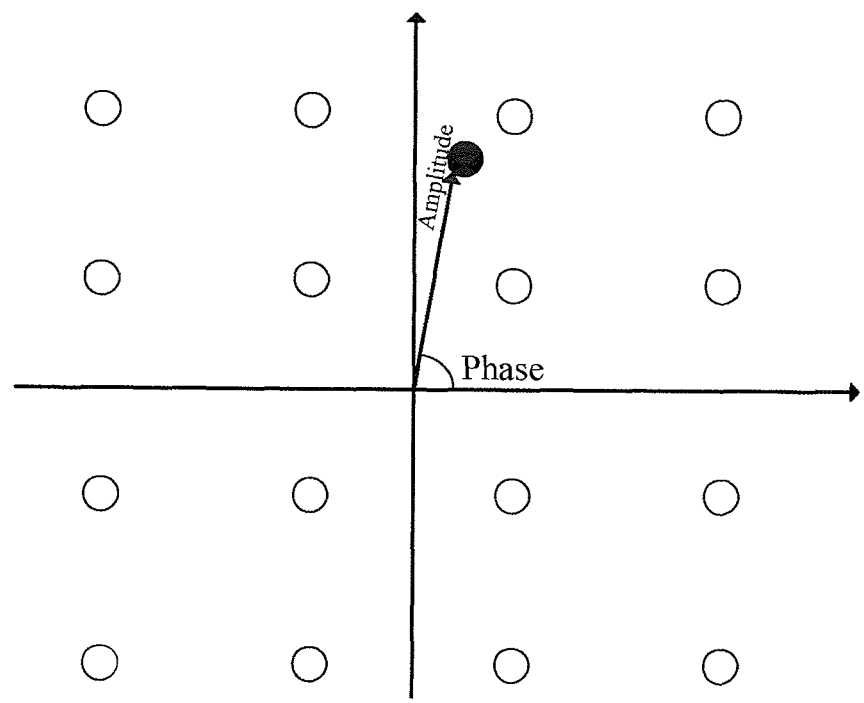
FIG. 15 shows a 16QAM constellation according to an embodiment of the present invention.

As shown in FIG. 15, white circles represent constellation points of 16QAM modulation, and a black circle represents a position of a received signal in a 16QAM constellation, where this point is connected to origin of coordinates, and may be represented by amplitude and phase.

Figure 16:
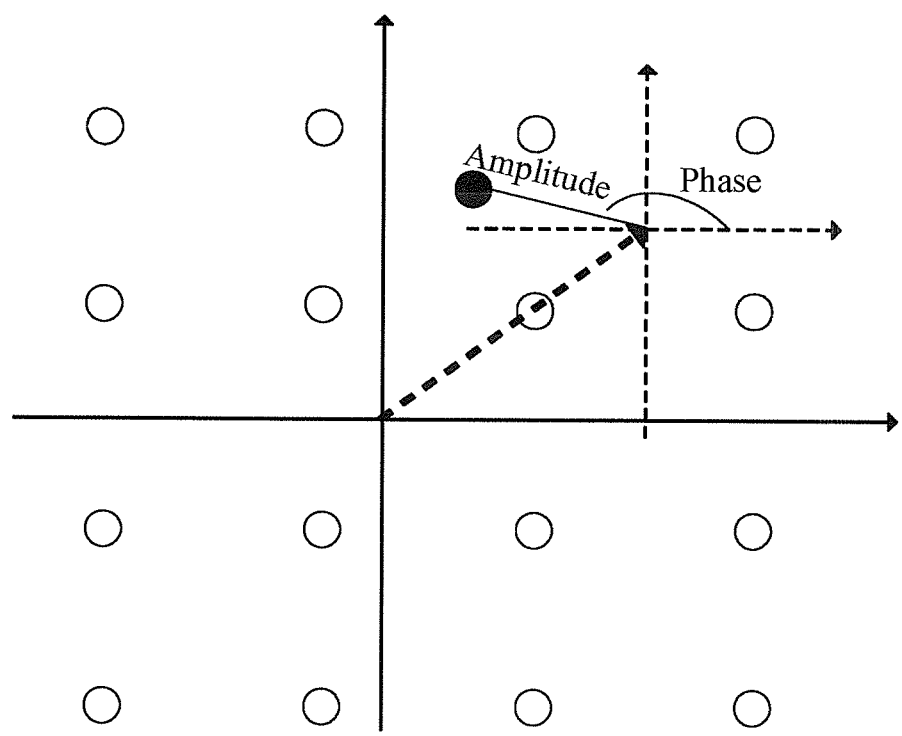
FIG. 16 is a diagram of constellation translation according to an embodiment of the present invention.

According to the method described in the foregoing, it is first determined that this point is in a first quadrant, and then coordinates are translated to the first quadrant, where as shown in FIG. 16, at new coordinates, constellation points in the first quadrant are similar to QPSK, amplitude/phase conversion is performed on the signal after constellation translation according to the new coordinates, where the signal after constellation translation is represented by using new amplitude and phase, the new amplitude is quantized by using 7 bits to obtain a quantized amplitude signal of the PUSCH (that is, the amplitude signal of the time-domain PUSCH signal), and the new phase after coordinate translation is quantized by using 14 bits to obtain a quantized phase signal of the PUSCH (the phase signal of the time-domain PUSCH signal).

Figure 17:
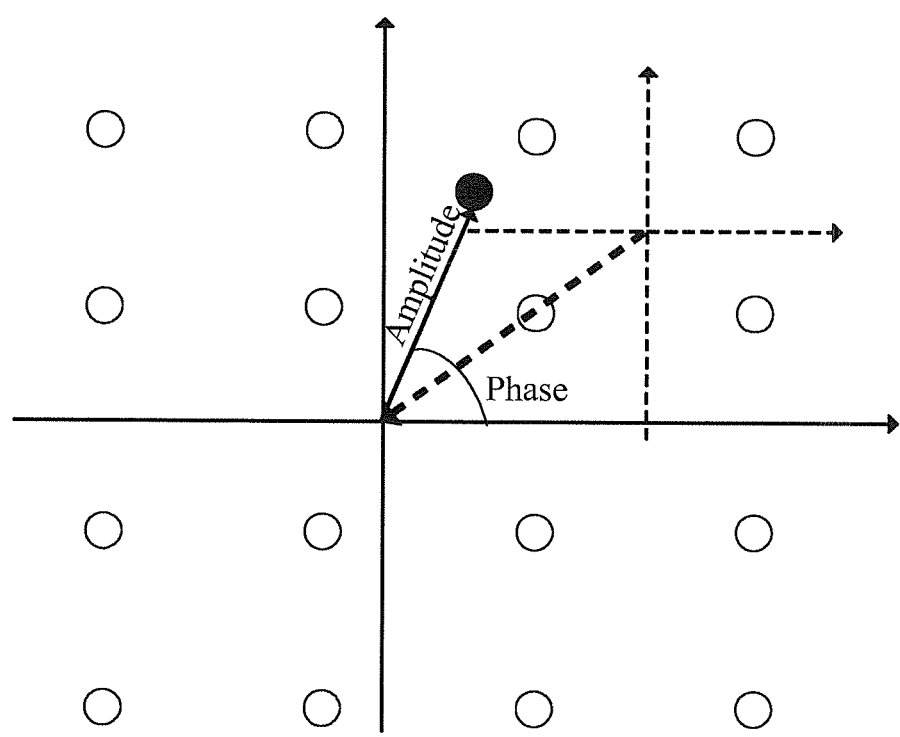
FIG. 17 is a diagram of constellation translation according to an embodiment of the present invention.
Figure 19:
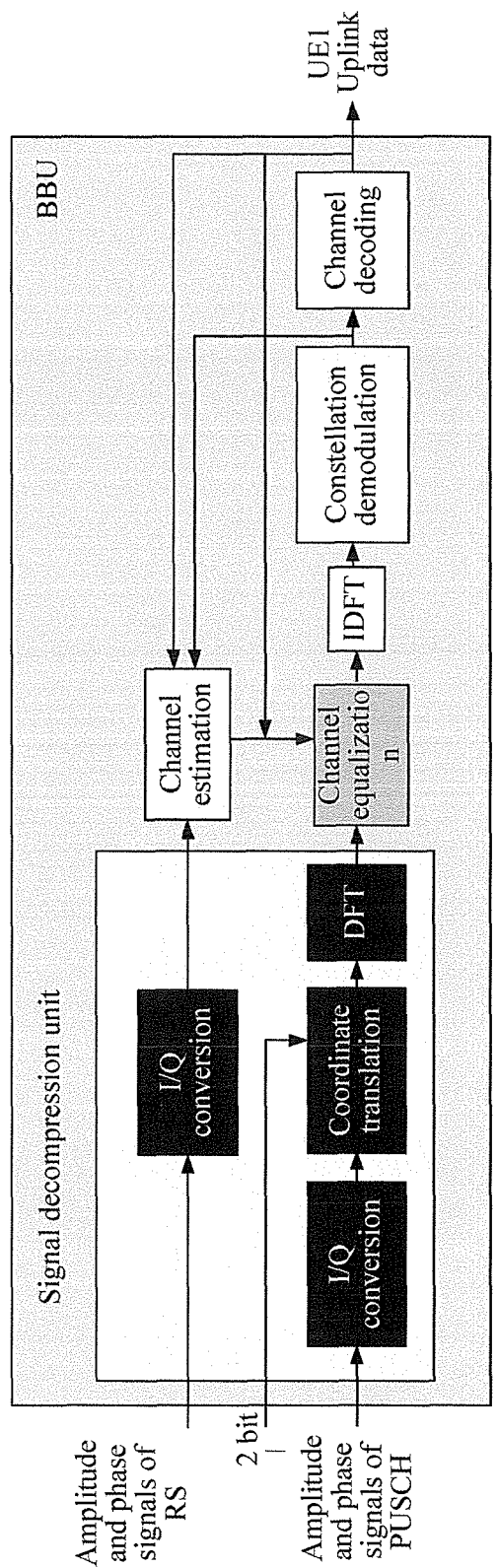
FIG. 19 is a schematic diagram of an uplink baseband signal decompression method according to an embodiment of the present invention.

At a BBU side, the BBU receives amplitude and phase signals of the RS and amplitude and phase signals of the PUSCH from the RRU, and a 16QAM constellation point quadrant signal that is represented by using 2 bits, a processing procedure of which is shown in FIG. 19.

a) I/Q conversion is performed on the amplitude and phase signals of the RS (that is, the quantized amplitude signal of the RS and the quantized phase signal of the RS) to obtain a complex RS (the complex RS is a complex signal formed by I/Q components, that is, an RS I/Q complex signal), channel estimation is performed by using the signal, I/Q conversion is performed on the amplitude and phase signals of the PUSCH to obtain a complex PUSCH signal (the complex PUSCH signal is a complex signal formed by I/Q components, also called PUSCH I/Q complex signal), coordinate translation is performed according to a quadrant where the signal is located, as shown in FIG. 17, to obtain a corresponding 16QAM I/Q signal, DFT transform is performed on the signal, channel equalization processing is performed by using a channel, where the channel is obtained through estimation by using the RS, and IDFT transform, constellation demodulation and channel decoding are performed on channel equalized data to obtain uplink data of a user. As shown in FIG. 19, in one embodiment, to further improve system performance, data obtained after constellation demodulation or data obtained after channel decoding may be fed back to assist channel estimation or channel equalization.

In this embodiment of the present invention, with the foregoing technical solution, during LTE uplink transmission, compression processing is performed on a signal at an RRU side, where according to the method provided in this embodiment of the present invention, IDFT is performed on a PUSCH signal that is obtained after resource block demapping; due to a characteristic of an extremely low peak to average power ratio of SC-FDMA modulation adopted by an LTE system, a signal after IDFT has an extremely low peak to average power ratio at this time, and an amplitude range of the signal changes slightly; amplitude/phase conversion is performed on the signal after the IDFT, where the signal after the IDFT is represented by using amplitude and phase, and then amplitude quantization and phase quantization are performed respectively to obtain a quantized amplitude signal and a quantized phase signal respectively, so that a baseband signal can be compressed efficiently; and corresponding decompression processing is adopted at a BBU side to recover data of a user, so that a transmission bandwidth of a baseband signal can be greatly reduced, thereby improving utilization efficiency of a resource.

Persons of ordinary skill in the art may understand that, all or a part of processes in the method according to the foregoing embodiments may be accomplished by a computer program instructing relevant hardware. The program may be stored in a computer-readable storage medium. When the program is executed, the processes of the method according to the foregoing embodiments are performed. The storage medium may be a magnetic disk, an optical disk, a Read-Only Memory (Read-Only Memory, ROM), a Random Access Memory (Random Access Memory, RAM), or the like.

The foregoing descriptions are only several embodiments of the present invention, and persons skilled in the art may make various modifications or variations to the present inven-

What is claimed is:

1. A baseband data compression device, comprising:
a signal obtaining module, configured to obtain a physical uplink shared channel (PUSCH) signal according to an uplink time-domain baseband signal of a user; wherein the signal obtaining module comprises:
an uplink baseband signal obtaining unit, configured to obtain an uplink time-domain baseband signal of a user,
a cyclic prefix (CP) removing unit, configured to remove a CP of the uplink time-domain baseband signal of the user to obtain a CP-removed uplink time-domain baseband signal,
a time-frequency transform unit, configured to perform fast Fourier transform (FFT) on the CP-removed uplink time-domain baseband signal to transform the CP-removed uplink time-domain baseband signal into an uplink frequency-domain baseband signal, and
a resource block demapping unit, configured to perform resource block demapping on the uplink frequency-domain baseband signal to separate a PUSCH signal from the uplink frequency-domain baseband signal, wherein the resource block demapping unit is further configured to perform resource block demapping on the uplink frequency-domain baseband signal to separate an uplink reference signal (RS) from the uplink frequency-domain baseband signal;
a frequency-time transform module, configured to perform inverse discrete Fourier transform (IDFT) on the PUSCH signal to obtain a time-domain PUSCH signal;
an amplitude/phase conversion module, configured to perform amplitude/phase conversion on the time-domain PUSCH signal to obtain an amplitude signal and a phase signal of the time-domain PUSCH signal, wherein the amplitude/phase conversion module is further configured to perform amplitude/phase conversion on the RS to obtain an amplitude signal and a phase signal of the RS; and
a quantization module, configured to perform amplitude quantization and phase quantization on the amplitude signal and the phase signal of the time-domain PUSCH signal respectively to obtain a quantized amplitude signal and a quantized phase signal of the time-domain PUSCH signal, wherein the quantization module is further configured to perform amplitude quantization and phase quantization on the amplitude signal and the phase signal of the RS respectively to obtain a quantized amplitude signal and a quantized phase signal of the RS.

2. The baseband data compression device according to claim 1, further comprising:
a transmitting module, configured to transmit the quantized amplitude signal and the quantized phase signal of the time-domain PUSCH signal.

3. A baseband data compression device, comprising:
a signal obtaining module, configured to obtain a physical uplink shared channel (PUSCH) signal according to an uplink time-domain baseband signal of a user;
a frequency-time transform module, configured to perform inverse discrete Fourier transform (IDFT) on the PUSCH signal to obtain a time-domain PUSCH signal;
an amplitude/phase conversion module, configured to perform amplitude/phase conversion on the time-domain PUSCH signal to obtain an amplitude signal and a phase signal of the time-domain PUSCH signal;
a quantization module, configured to perform amplitude quantization and phase quantization on the amplitude signal and the phase signal of the time-domain PUSCH signal respectively to obtain a quantized amplitude signal and a quantized phase signal of the time-domain PUSCH signal; and
a coordinate translation module, configured to translate, according to a constellation quadrant where the time-domain PUSCH signal is located, an origin of coordinates to a preset position in the constellation quadrant where the time-domain PUSCH signal is located, and obtain coordinates of the time-domain PUSCH signal after the origin of coordinates is translated; wherein
the amplitude/phase conversion module is configured to perform amplitude/phase conversion on the time-domain PUSCH signal according to the coordinates of the time-domain PUSCH signal, wherein the coordinates of the time-domain PUSCH signal are obtained after the origin of coordinates is translated, to obtain an amplitude signal and a phase signal of the time-domain PUSCH signal.

4. The baseband data compression device according to claim 1, further comprising:
an RS channel estimation module, configured to perform channel estimation on the RS to obtain an estimated channel of the RS; and
a multiple-input multiple-output MIMO detection module, configured to perform MIMO detection on the PUSCH signal according to the estimated channel of the RS to obtain a MIMO-detected PUSCH signal; wherein
the frequency-time transform module is configured to perform IDFT on the MIMO-detected PUSCH signal to obtain a time-domain PUSCH signal.

5. The baseband data compression device according to claim 2, wherein the transmitting module is further configured to transmit the quantized amplitude signal and the quantized phase signal of the RS.

6. A baseband data decompression device, comprising:
a first obtaining module, configured to obtain a quantized amplitude signal and a quantized phase signal of a time-domain PUSCH signal;
an I/Q conversion module, configured to perform I/Q conversion on the quantized amplitude signal and the quantized phase signal of the time-domain PUSCH signal to obtain a complex PUSCH signal, wherein the complex PUSCH signal is a complex signal formed by I/Q components;
a first transform module, configured to perform discrete Fourier transform (DFT) on the complex PUSCH signal to map the complex PUSCH signal to a frequency domain;
a second transform module, configured to perform inverse discrete Fourier transform (IDFT) on the PUSCH signal that undergoes the DFT, to obtain a time-domain PUSCH signal;
a demodulation module, configured to perform constellation demodulation on the time-domain PUSCH signal to obtain demodulated data; and
a decoding module, configured to perform channel decoding on the demodulated data to obtain uplink data of a user.

7. The baseband data decompression device according to claim 6, further comprising:

a second obtaining module, configured to obtain a quantized amplitude signal and a quantized phase signal of an RS.

8. The baseband data decompression device according to claim 7, further comprising:
a channel estimation module, configured to perform channel estimation on the quantized amplitude signal and the quantized phase signal of the RS to obtain an estimated signal.

9. The baseband data decompression device according to claim 7, wherein the I/Q conversion module is further configured to perform I/Q conversion on the quantized amplitude signal and the quantized phase signal of the RS to obtain a complex RS, wherein the complex RS is a complex signal formed by I/Q components.

10. The baseband data decompression device according to claim 9, wherein the channel estimation module is configured to perform channel estimation on the complex RS to obtain an estimated signal.

11. The baseband data decompression device according to claim 8, further comprising:
a channel equalization module, configured to perform, by using the estimated signal, channel equalization on the PUSCH signal that undergoes the DFT, to obtain a channel equalized PUSCH signal.

12. The baseband data decompression device according to claim 9, wherein the second transform module is configured to perform IDFT on the channel equalized PUSCH signal to obtain a time-domain PUSCH signal.

13. The baseband data decompression device according to claim 6, further comprising:
a coordinate inverse translation module, configured to reset an origin of coordinates according to a constellation quadrant where the complex PUSCH signal is located.

14. An uplink baseband signal compression method, comprising:
obtaining a physical uplink shared channel (PUSCH) signal according to an uplink time-domain baseband signal of a user; wherein the obtaining a physical uplink shared channel PUSCH signal according to an uplink time-domain baseband signal of a user comprises:
obtaining an uplink time-domain baseband signal of a user,
removing a cyclic prefix (CP) of the uplink time-domain baseband signal of the user to obtain a CP-removed uplink time-domain baseband signal,
performing fast Fourier transform (FFT) on the CP-removed uplink time-domain baseband signal to transform the CP-removed uplink time-domain baseband signal into an uplink frequency-domain baseband signal, and
performing resource block demapping on the uplink frequency-domain baseband signal to separate a PUSCH signal from the uplink frequency-domain baseband signal;
performing inverse discrete Fourier transform (IDFT) on the PUSCH signal to obtain a time-domain PUSCH signal;
performing amplitude/phase conversion on the time-domain PUSCH signal to obtain an amplitude signal and a phase signal of the time-domain PUSCH signal;
performing amplitude quantization and phase quantization on the amplitude signal and the phase signal of the time-domain PUSCH signal respectively to obtain a quantized amplitude signal and a quantized phase signal of the time-domain PUSCH signal;

performing resource block demapping on the uplink frequency-domain baseband signal to separate a reference signal (RS) from the uplink frequency-domain baseband signal;
performing amplitude/phase conversion on the RS to obtain an amplitude signal and a phase signal of the RS; and
performing amplitude quantization and phase quantization on the amplitude signal and the phase signal of the RS respectively to obtain a quantized amplitude signal and a quantized phase signal of the RS.

15. The method according to claim 14, further comprising:
transmitting the quantized amplitude signal and the quantized phase signal of the time-domain PUSCH signal.

16. The method according to claim 14, further comprising:
transmitting the quantized amplitude signal and the quantized phase signal of the RS.

17. The method according to claim 14, further comprising:
performing channel estimation on the RS to obtain an estimated channel of the RS; and
performing MIMO detection on the PUSCH signal according to the estimated channel of the RS to obtain a MIMO-detected PUSCH signal; wherein
the performing inverse discrete Fourier transform IDFT on the PUSCH signal to obtain a time-domain PUSCH signal comprises:
performing IDFT on the MIMO-detected PUSCH signal to obtain a time-domain PUSCH signal.

18. An uplink baseband signal compression method, comprising:
obtaining a physical uplink shared channel (PUSCH) signal according to an uplink time-domain baseband signal of a user;
performing inverse discrete Fourier transform (IDFT) on the PUSCH signal to obtain a time-domain PUSCH signal;
performing amplitude/phase conversion on the time-domain PUSCH signal to obtain an amplitude signal and a phase signal of the time-domain PUSCH signal;
performing amplitude quantization and phase quantization on the amplitude signal and the phase signal of the time-domain PUSCH signal respectively to obtain a quantized amplitude signal and a quantized phase signal of the time-domain PUSCH signal; and
translating, according to a constellation quadrant where the time-domain PUSCH signal is located, an origin of coordinates to a preset position in the constellation quadrant where the time-domain PUSCH signal is located, and obtaining coordinates of the time-domain PUSCH signal after the origin of coordinates is translated; wherein
the performing amplitude/phase conversion on the time-domain PUSCH signal to obtain an amplitude signal and a phase signal of the time-domain PUSCH signal comprises:
performing amplitude/phase conversion on the time-domain PUSCH signal according to the coordinates of the time-domain PUSCH signal, wherein the coordinates of the time-domain PUSCH signal are obtained after the origin of coordinates is translated, to obtain an amplitude signal and a phase signal of the time-domain PUSCH signal.

19. An uplink baseband signal decompression method, comprising:
obtaining a quantized amplitude signal and a quantized phase signal of a time-domain PUSCH signal;
performing I/Q conversion on the quantized amplitude signal and the quantized phase signal of the time-domain PUSCH signal to obtain a complex PUSCH signal, wherein the complex PUSCH signal is a complex signal formed by I/Q components;

performing discrete Fourier transform (DFT) on the complex PUSCH signal to map the complex PUSCH signal to a frequency domain;

performing inverse discrete Fourier transform (IDFT) on the PUSCH signal that undergoes the DFT, to obtain a time-domain PUSCH signal;

performing constellation demodulation on the time-domain PUSCH signal to obtain demodulated data; and decoding the demodulated data to obtain uplink data of a user.

20. The method according to claim 19, further comprising:

obtaining a quantized amplitude signal and a quantized phase signal of an RS;

performing channel estimation on the quantized amplitude signal and the quantized phase signal of the RS to obtain an estimated signal; and performing, by using the estimated signal, channel equalization on the PUSCH signal that undergoes the DFT, to obtain a channel equalized PUSCH signal.

21. The method according to claim 20, wherein the performing IDFT on the PUSCH signal that undergoes the DFT, to obtain a time-domain PUSCH signal comprises:

performing IDFT on the channel equalized PUSCH signal to obtain a time-domain PUSCH signal.

22. The method according to claim 20, further comprising:

performing I/Q conversion on the quantized amplitude signal and the quantized phase signal of the RS to obtain a complex RS, wherein the complex RS is a complex signal formed by I/Q components; wherein the performing channel estimation on the quantized amplitude signal and the quantized phase signal of the RS to obtain an estimated signal comprises:

performing channel estimation on the complex RS to obtain an estimated signal.

23. The method according to claim 19, further comprising:

resetting an origin of coordinates according to a constellation quadrant where the complex PUSCH signal is located.

\* \* \* \* \*